US012772456B2

(12) United States Patent
Müller et al.

(10) Patent No.: US 12,772,456 B2
(45) Date of Patent: Oct. 20, 2026

(54) MEMORY CELL AND METHOD FOR CHANGING PROPERTIES OF AN ELECTRODE

(71) Applicant: Ferroelectric Memory GmbH, Dresden (DE)

(72) Inventors: Stefan Ferdinand Müller, Radebeul (DE); Tony Schenk, Dresden (DE); Alireza Kashir, Dresden (DE)

(73) Assignee: Ferroelectric Memory GmbH, Dresden (DE)

( * ) Notice: Subject to any disclaimer, the term of this patent is extended or adjusted under 35 U.S.C. 154(b) by 502 days.

(21) Appl. No.: 18/352,659

(22) Filed: Jul. 14, 2023

(65) Prior Publication Data

US 2024/0032307 A1 Jan. 25, 2024

(30) Foreign Application Priority Data

Jul. 15, 2022 (DE) ..................... 10 2022 117 774.2

(51) Int. Cl.
*H10B 53/30* (2023.01)

(52) U.S. Cl.
CPC .................................... *H10B 53/30* (2023.02)

(58) Field of Classification Search
CPC ................................ H10B 53/30; H10D 1/682
See application file for complete search history.

(56) References Cited

U.S. PATENT DOCUMENTS

| | | | |
|---|---|---|---|
| 10,978,129 | B1 | 4/2021 | Muller |
| 11,049,541 | B2 | 6/2021 | Muller |
| 11,081,159 | B1 | 8/2021 | Jahne et al. |
| 11,101,291 | B2 | 8/2021 | Mennenga et al. |
| 11,158,361 | B2 | 10/2021 | Muller |
| 11,189,331 | B1 | 11/2021 | Benoist et al. |
| 11,195,589 | B1 | 12/2021 | Ocker et al. |
| 11,289,145 | B2 | 3/2022 | Ocker |
| 11,309,034 | B2 | 4/2022 | Mennenga et al. |
| 11,309,792 | B2 | 4/2022 | Iqbal et al. |
| 11,309,793 | B2 | 4/2022 | Iqbal |
| 11,335,391 | B1 | 5/2022 | Ocker |
| 11,380,400 | B2 | 7/2022 | Noack |
| 11,380,695 | B2 | 7/2022 | Ocker |
| 11,387,254 | B2 | 7/2022 | Noack |
| 11,393,518 | B1 | 7/2022 | Ocker |

(Continued)

OTHER PUBLICATIONS

Chattaraj et al., "Unravelling Oxygen Driven a to ß Phase Transformation in Tungsten", Scientific Reports, Sep. 7, 2020, 10 pages.

(Continued)

*Primary Examiner* — S M Sohel Imtiaz
(74) *Attorney, Agent, or Firm* — Natalie Albrecht

(57) ABSTRACT

Various aspects relate to a memory cell including: a first electrode; a second electrode; and a memory element disposed between the first electrode and the second electrode. The memory element includes a spontaneously polarizable material. The first electrode, the second electrode, and the memory element forming a memory capacitor. The first electrode and/or the second electrode includes: an electrically conductive electrode layer, and a functional layer comprising a semi-conductive material, wherein the functional layer is in direct physical contact with the memory element.

19 Claims, 18 Drawing Sheets

(56) References Cited

U.S. PATENT DOCUMENTS

| | | | | |
|---|---|---|---|---|
| 11,437,402 | B2 | 9/2022 | Noack | |
| 11,443,792 | B1 | 9/2022 | Iqbal et al. | |
| 11,475,935 | B1 | 10/2022 | Ocker | |
| 11,508,426 | B1 | 11/2022 | Ocker | |
| 11,508,428 | B2 | 11/2022 | Noack et al. | |
| 11,508,756 | B2 | 11/2022 | Mennenga et al. | |
| 11,527,551 | B2 | 12/2022 | Ocker | |
| 11,594,271 | B2 | 2/2023 | Noack et al. | |
| 11,594,542 | B2 | 2/2023 | Polakowski | |
| 11,605,435 | B2 | 3/2023 | Schenk | |
| 11,610,903 | B2 | 3/2023 | Schenk | |
| 11,626,164 | B2 | 4/2023 | Noack | |
| 11,682,461 | B2 | 6/2023 | Mennenga et al. | |
| 11,688,447 | B2 | 6/2023 | Ocker | |
| 2006/0099724 | A1 * | 5/2006 | Hsu | H10N 70/826 438/381 |
| 2019/0130956 | A1 * | 5/2019 | Müller | G11C 11/2273 |
| 2021/0082958 | A1 * | 3/2021 | Mennenga | G11C 11/221 |
| 2021/0091097 | A1 * | 3/2021 | Mennenga | H10B 53/20 |
| 2021/0125656 | A1 * | 4/2021 | Müller | G11C 11/223 |
| 2022/0109074 | A1 * | 4/2022 | Pesic | H10D 1/62 |
| 2022/0122995 | A1 | 4/2022 | Ocker et al. | |
| 2022/0122996 | A1 | 4/2022 | Ocker et al. | |
| 2022/0139932 | A1 | 5/2022 | Polakowski | |
| 2022/0139934 | A1 | 5/2022 | Muller | |
| 2022/0139937 | A1 | 5/2022 | Muller et al. | |
| 2022/0270659 | A1 | 8/2022 | Ocker | |
| 2022/0374202 | A1 | 11/2022 | Villa et al. | |
| 2022/0376114 | A1 | 11/2022 | Muller | |
| 2023/0041759 | A1 | 2/2023 | Noack et al. | |
| 2023/0046259 | A1 | 2/2023 | Iqbal | |
| 2023/0135718 | A1 | 5/2023 | Minh et al. | |
| 2023/0170029 | A1 | 6/2023 | Sivero | |
| 2023/0189531 | A1 | 6/2023 | Muller | |
| 2023/0189532 | A1 | 6/2023 | Muller | |
| 2023/0223066 | A1 | 7/2023 | Muller | |
| 2023/0247842 | A1 | 8/2023 | Muller | |
| 2023/0284454 | A1 | 9/2023 | Ocker et al. | |
| 2023/0335174 | A1 | 10/2023 | Kuzmanov | |
| 2023/0360684 | A1 | 11/2023 | Sivero | |
| 2023/0371268 | A1 | 11/2023 | Muller | |
| 2023/0380179 | A1 * | 11/2023 | Lin | H10B 53/30 |
| 2023/0413550 | A1 * | 12/2023 | Kong | H10B 43/27 |

OTHER PUBLICATIONS

Chou et al., "Wake-up free Hf0.5Zr0.5O2 thin film with enhanced ferroelectricity and reliability synthesized by atomic layer crystallization induced by substrate biasing", Acta Materialia (2022), Feb. 15, 2022, 21 pages, Published by Elsevier Ltd.

Kashir et al., "Large remnant polarization in a wake-up free Hf0.5Zr0.5O2 ferroelectric film through bulk and interface engineering", published Jan. 20, 2021, 24 pages.

Kashir et al., "Ferroelectric and dielectric properties of Hf0.5Zr0.5O2 thin film near morphotropic phase boundary", published Feb. 9, 2021, 17 pages.

Yadav et al., "High Polarization and Wake-up Free Ferroelectric Characteristics in Ultrathin Hf0.5Zr0.5O2 Devices by Control of Oxygen-Deficient Layer", Nanotechnology, 2021, published Dec. 3, 2021, 14 pages.

Kashir et al., "Defect engineering for control of wake-up effect in HfO2-based ferroelectrics", first published: Sep. 17, 2020, 21 pages.

Oh et al., "Effect of dead layers on the ferroelectric property of ultrathin HfZrOx film", Applied Physics Letters 117, Dec. 23, 2020, 5 pages, Published by AIP Publishing.

Migita et al., "Polarization switching behavior of Hf—Zr—O ferroelectric ultrathin films studied through coercive field characteristics", Mar. 5, 2018, 7 pages, Published by The Japan Society of Applied Physics 57.

* cited by examiner

MEMORY CELL AND METHOD FOR CHANGING PROPERTIES OF AN ELECTRODE

CROSS-REFERENCE TO RELATED APPLICATION(S)

This application claims priority to German Patent Application 10 2022 117 774.2, filed on Jul. 15, 2022, the entire contents of which are incorporated herein by reference.

TECHNICAL FIELD

Various aspects relate to a memory cell, a memory capacitor layer stack, a memory cell arrangement, methods for processing a memory capacitor, and methods for changing properties (e.g., structural properties, mechanical properties, and/or electronic properties) of an electrode of a memory capacitor.

BACKGROUND

In general, various computer memory technologies have been developed in the semiconductor industry. A fundamental building block of computer memory may be referred to as a memory cell. The memory cell may be an electronic circuit that is configured to store at least one segment or piece of information (e.g., bitwise). As an example, the memory cell may have at least two memory states representing, for example, a logic "1" and a logic "0". In general, the information may be maintained (e.g., stored) in a memory cell until the memory state of the memory cell is modified, e.g., in a controlled manner. The information stored in the memory cell may be obtained (e.g., read out) by determining in which of the memory states the memory cell is residing in. At present, various types of memory cells may be used to store data. By way of example, a type of memory cell may include a thin film of a spontaneous-polarizable material (e.g., a ferroelectric material or a configuration of an anti-ferroelectric material) whose polarization state may be changed in a controlled fashion to store data in the memory cell (e.g., in a non-volatile manner). A memory cell or an arrangement of memory cells may be integrated, for example, on a wafer or a chip together with one or more logic circuits.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various aspects of the invention are described with reference to the following drawings, in which.

DESCRIPTION

Figure 1A:
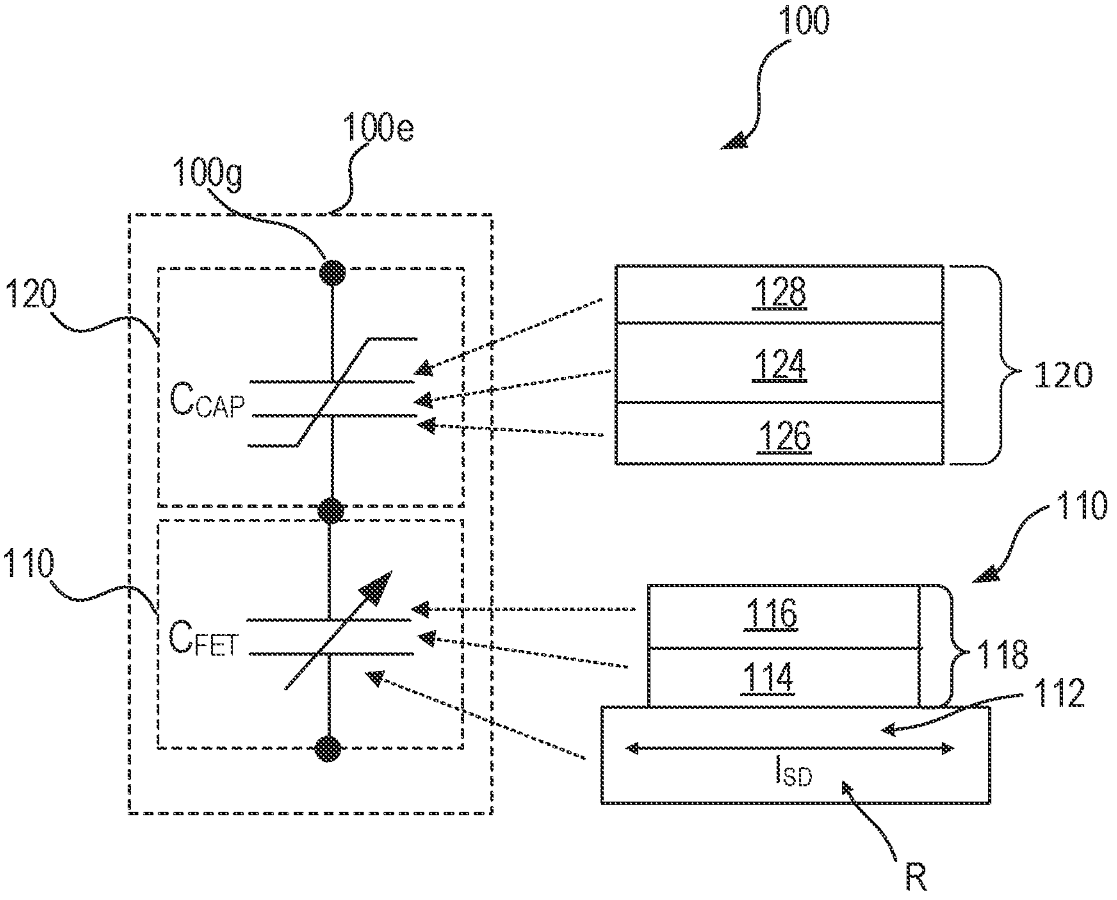
FIG. 1A shows various aspects of a memory structure in a schematic view.

The following detailed description refers to the accompanying drawings that show, by way of illustration, specific details, and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects may be combined with one or more other aspects to form new aspects. Various aspects are described in connection with methods and various aspects are described in connection with devices (e.g., a memory cell or a memory capacitor). However, it may be understood that aspects described in connection with methods may similarly apply to the devices, and vice versa.

In the semiconductor industry, the integration of non-volatile memory technologies, sensor technologies, transmitter technologies, electronic filter technologies, receiver technologies, and the like may be useful for various types of devices and applications. According to various aspects, an electronic device (e.g., a non-volatile memory) may be integrated on a chip.

Various aspects relate to a memory cell, a memory capacitor layer stack, and a memory cell arrangement, each having a memory capacitor having a memory element including or consisting of a spontaneously polarizable material (e.g., referred to as spontaneously polarizable capacitor structure). The memory capacitor may include at least one functional layer (e.g., exactly one functional layer, two functional layers, more than two functional layers, etc.). According to various aspects, at least one functional layer may include or may consist of a (e.g., electrically) semi-conductive material. Herein, a thermally activated conductive material may be understood as being semi-conductive. According to various aspects, at least one of the at least one functional layer may include or may consist of an amorphous material. The functional layer may be disposed in direct contact with the spontaneously polarizable material of the memory element. The memory capacitor may be configured such that, by application of an electric field at electrodes of the memory capacitor, polarization properties of the spontaneously polarizable material can be changed (e.g., modified). The memory capacitor may be configured such that, by application of an electric field at electrodes of the memory capacitor, anions (e.g., oxygen) of the spontaneously polarizable material are transferred from the spontaneously polarizable material into the amorphous material, thereby changing the structure (e.g., the crystal structure) of the spontaneously polarizable material (and optionally also the structure of a semi-conductive and/or amorphous material of the functional layer). In the following, a material which the functional layer includes or of which the functional layer consists may be referred to as functional material. This functional material may be semiconductive and/or amorphous. The memory capacitor may be configured such that, by application of an electric field at electrodes of the memory capacitor, anions (e.g., oxygen) of the spontaneously polarizable material and/or of the functional material are transferred from the functional material into the spontaneously polarizable material, thereby changing the structure (e.g., the crystal structure) of the spontaneously polarizable material (and optionally also the structure of the amorphous material). Hence, the structural properties and, thus, also the polarization properties of the spontaneously polarizable material may be controlled by applying, in use, an electric field on the electrodes of the memory capacitor. Illustratively, the functional material may serve as an anion (e.g., oxygen) sink storing anions from the spontaneously polarizable material and/or may serve as an anion (e.g., oxygen) source providing anions to the spontaneously polarizable material.

FIG. 1A shows various aspects of a memory structure 100. The memory structure 100 may be a field-effect transistor (FET) based capacitive memory structure. The memory structure 100 may include a field-effect transistor structure 110 and a capacitive memory structure, such as a spontaneously polarizable capacitor (SPOC) structure 120. In some aspects, the SPOC structure 120 may be coupled to the field-effect transistor structure 110. The SPOC structure 120 may include at least two electrodes (e.g., two electrode layers), such as a first electrode 126 and a second electrode 128. The SPOC structure 120 may include a memory element 124. The memory element 124 may be disposed between the first electrode 126 and the second electrode 128. The memory element 124 may include or may consist of a spontaneously polarizable material. A memory element including or consisting of a spontaneously polarizable material may also be referred to as a spontaneously-polarizable memory element 124. For example, the spontaneously polarizable material may be a remanent polarizable material, such as a ferroelectric material, or a non-remanent polarizable material, such as an anti-ferroelectric material. According to various aspects, the first electrode 126, the second electrode 128, and the memory element 124 may form the SPOC structure 120. The SPOC structure 120 may, in some aspects, also be referred to as a memory capacitor.

The spontaneously-polarizable memory element 124 may show a hysteresis in the (voltage dependent) polarization. The spontaneously-polarizable memory element 124 may show non-remanent spontaneous polarization (e.g., may show anti-ferroelectric properties). For example, the spontaneously-polarizable memory element may have no or no substantial remanent polarization remaining in the case that no voltage drops over the spontaneously-polarizable memory element 124. In other aspects, the spontaneously-polarizable memory element 124 may show remanent spontaneous polarization (e.g., may show ferroelectric properties). For example, the spontaneously-polarizable memory element 124 may have a remanent polarization or a substantial remanent polarization remaining in the case that no voltage drops over the spontaneously-polarizable memory element.

The terms "spontaneously polarized" or "spontaneous polarization" may be used herein, for example, with reference to the polarization capability of a material beyond dielectric polarization. A "spontaneously-polarizable" (or "spontaneous-polarizable") material may be or may include a spontaneously-polarizable material that shows a remanence (e.g., a ferroelectric material), and/or a spontaneously-polarizable material that shows no remanence, (e.g., an anti-ferroelectric material). The coercivity of the spontaneously-polarizable material may be a measure of the strength of the reverse polarizing electric field that may be required to remove a remanent polarization.

A spontaneous polarization (e.g., a remanent or non-remanent spontaneous polarization) may be evaluated via analyzing one or more hysteresis measurements (e.g., hysteresis curves), that may be in a plot of polarization, P, versus electric field, E, in which the material is polarized into opposite directions. The polarization capability of a material (dielectric polarization, spontaneous polarization, and a remanence characteristics of the polarization) may be analyzed using capacity spectroscopy, (e.g., via a static (C-V) and/or time-resolved measurement or by polarization-voltage (P-V) or positive-up-negative-down (PUND) measurements).

According to various aspects, in various types of applications (e.g., in memory technology), a remanent polarization as low as 0 $\mu C/cm^2$ to 3 $\mu C/cm^2$ may be regarded as no substantial remanent polarization. Such low values of a remanent polarization may be present in a layer or material due to undesired effects (e.g., due to a not ideal layer formation). According to various aspects, in various types of applications (e.g., in memory technology), a remanent polarization greater than 3 $\mu C/cm^2$ may be regarded as substantial remanent polarization. Such a substantial remanent polarization may allow for storing information as a function of a polarization state of a spontaneously polarizable layer or a spontaneously polarizable material.

In general, a remanent polarization (also referred to as retentivity or remanence) may be present in a material layer in the case that the material layer may remain polarized upon reduction of an applied electric field (E) to zero, therefore, a certain value for the electrical polarization (P) of the material layer may be detected. Illustratively, a polarization remaining in a material when the electric field is reduced to zero may be referred to as remanent polarization. Therefore, the remanence of a material may be a measure of the residual polarization in the material in the case that an applied electric field is removed. In general, ferroelectricity and anti-ferroelectricity may be concepts to describe a spontaneous polarization of a material similar to ferromagnetism and anti-ferromagnetism used to describe remanent magnetization in magnetic materials. According to various aspects, an electric coercive field, $E_C$, (also referred to as a coercive field) may be or may represent the electric field required to depolarize a remanent-polarizable layer.

According to various aspects, the spontaneously-polarizable memory element 124 may include or may consist of a remanent-polarizable material. A remanent-polarizable material may be a material that is remanently polarizable and shows a remanence of the spontaneous polarization, such as a ferroelectric material. In other aspects, remanent-polarizable material may be a material that is spontaneously polarizable and that shows no remanence (e.g., an anti-ferroelectric material) under the additional conditions that measures are implemented to generate an internal electric-field within the anti-ferroelectric material. Hence, a non-remanently polarizable material, such as an anti-ferroelectric ("antiferroelectric") material may exhibit remanent polarizable properties within certain structures. An internal electric-field within an anti-ferroelectric material may be caused (e.g., applied, generated, or maintained) by various strategies such as by implementing floating nodes that may be charged to voltages different from zero volts, and/or by implementing charge storage layers, and/or by using doped layers, and/or by using electrode layers that adapt electronic work-functions to generate an internal electric field, by using an encapsulation structure which introduces compressive stress or tensile stress onto the memory element 124, thereby establishing the spontaneously polarizable properties, only as examples. The spontaneously-polarizable memory element 124 including or being made of a remanent-polarizable material may be referred to herein as remanent-polarizable memory element (e.g., a remanent-polarizable layer).

In some aspects, the spontaneous-polarizable material (e.g., a remanent-polarizable material) may be based on at least one metal oxide. Illustratively, a composition of the spontaneous-polarizable material may include the at least one metal oxide for more than 50%, or more than 66%, or more than 75%, or more than 90%. In some aspects, the spontaneous-polarizable material may include one or more metal oxides. The spontaneous-polarizable material may include (or may be based on) at least one of $Hf_aO_b$, $Zr_aO_b$, $Si_aO_b$, $Y_aO_b$, as examples, wherein the subscripts "a" and "b" may indicate the number of the respective atom in the spontaneous-polarizable material.

In some aspects, the spontaneous-polarizable material (e.g., the remanent-polarizable material) may be or may include a ferroelectric material, illustratively the memory element 124 may be ferroelectric memory element (e.g., a ferroelectric layer). A ferroelectric material may be an example of a material used in a spontaneously-polarizable memory element (e.g., in a remanent-polarizable element). The ferroelectric material may be or may include at least one of the following: hafnium oxide (ferroelectric hafnium oxide, $HfO_2$), zirconium oxide (ferroelectric zirconium oxide, $ZrO_2$), a (ferroelectric) mixture of hafnium oxide and zirconium oxide. Ferroelectric hafnium oxide may include any form of hafnium oxide that may exhibit ferroelectric properties. Ferroelectric zirconium oxide may include any form of zirconium oxide that may exhibit ferroelectric properties. This may include, for example, hafnium oxide, zirconium oxide, a solid solution of hafnium oxide and zirconium oxide (e.g., but not limited to a 1:1 mixture) or hafnium oxide and/or zirconium oxide doped or substituted with one or more of the following elements (non-exhaustive list):silicon, aluminum, gadolinium, yttrium, lanthanum, strontium, zirconium, any of the rare earth elements or any other dopant (also referred to as doping agent) that is suitable to provide or maintain ferroelectricity in hafnium oxide or zirconium oxide. The ferroelectric material may be doped at a concentration from about 2 mol % to about 6 mol %, only as an example.

In some aspects, the spontaneous-polarizable material may include hafnium oxide (e.g., may consist of hafnium oxide, hafnium zirconium oxide (e.g., $Hf_{0.5}Zr_{0.5}O_2$), hafnium silicon oxide, hafnium lanthanum oxide, or hafnium lanthanum zirconium oxide), zirconium oxide, and/or aluminum nitride (e.g., may consist of aluminum nitride, aluminum scandium nitride, or aluminum boron nitride). In some aspects, the spontaneous-polarizable material may include or may consist of $Hf_{1-x}Zr_xO_2$, $Hf_{1-x}Si_xO_2$, $Hf_{1-x}La_xO_2$, $Hf_{1-x-y}La_xZr_yO_2$, $Al_{1-x}Sc_xN$, or $Al_{1-x}B_xN$.

The spontaneously polarizable material of the memory element 124 may include or may consist of lead zirconate titanate ($Pb[Zr_xTi_{1-x}]O_3$, PZT) or strontium bismuth tantalate ($Sr_2Bi_2TaO_9$, SBT). However, there are several disadvantages for integrating PCT and SBT in complementary metal-oxide-semiconductor (CMOS):

- Polycrystalline PZT or SBT films may require a thickness of more than 70 nm in order to ensure that the complete film is ferroelectric. However, the lateral dimension in CMOS integration may not be scalable such that the thick films lead to huge height difference between the SPOC structure 120 and the logic area forming below the interlayer metallization.
- PZT and SBT require four elements and cannot be deposited using atomic layer deposition (ALD). Hence, PZT and SBT cannot be used for a 3D-integration of the SPOC structure 120, but merely for planar structures.
- PZT and SBT include elements which may contaminate CMOS facilities. PZT even includes lead (Pb) which is considered toxic. This may require a special encapsulation of the whole SPOC structure 120. Further, dedicated tools may be required for depositing the toxic elements.
- PZT and SBT have a comparatively small band gap (e.g., 3.0 to 3.5 eV for PZT). Hence, PZT and SBT cannot be used for devices that require low leakage currents through the SPOC structure 120.

As described, the spontaneously polarizable material of the memory element 124 may consist of hafnium zirconium oxide ($Hf_{1-x}Zr_x$, HZO) with $0 \leq x \leq 1$ (i.e., consisting of hafnium oxide in the case of x=0 and consisting of zirconium oxide in the case of x=1). There are several advantages of HZO for CMOS integration:

- HZO films are ferroelectric or antiferroelectric down to a thickness of 1 nm. Hence, the integration of the SPOC structure 120 in lateral dimension is scalable to a maximum degree.
- HZO films can be deposited using ALD. This allows the SPOC structure 120 to be manufactured having curved structures and allows a 3D-integration of the SPOC structure 120.
- HZO films are CMOS compatible and do not include any toxic elements. Hence, an encapsulation of the SPOC structure 120 may be optional and the standard CMOS equipment can be used.
- It may be possible to crystallize the HZO into the ferroelectric phase by annealing at temperatures in a range from about 300° C. to about 400° C. This allows an integration of the SPOC structure 120 as part of the interlayer metallization.
- HZO films have a large band gap (e.g., 5.8 eV for hafnium oxide). Thus, HZO can be used for devices that require a low leakage current.

According to various aspects, the memory capacitor as provided by the SPOC structure 120 may be or may include a ferroelectric capacitor (FeCAP) or an anti-ferroelectric capacitor (AFeCAP). Information may be stored by the memory capacitor via at least two remanent polarization states of the SPOC structure 120. The programming of the SPOC structure 120 (illustratively the storage of information therein) may be carried out by providing (e.g., applying) an electric field to thereby set or change the remanent polarization state of the spontaneously polarizable memory element 124. Illustratively, the spontaneous-polarizable material (e.g., a ferroelectric material or an anti-ferroelectric material) may be used to store data in non-volatile manner in integrated circuits.

It may be understood that, even though various aspects refer to a memory element including or being made of a spontaneously-polarizable material, other memory elements whose state may be altered by an electric field provided across a capacitive memory structure may be used as long as the structure of the material can be changed via application of an electric field, as described herein.

The SPOC structure 120 may have a capacitive configuration with a (first) capacitance, $C_{CAP}$, associated therewith (see equivalent circuit 100e in FIG. 1A with respect to the capacitive properties). The first electrode 126, the memory element 124, and the second electrode 128 may form a memory capacitor layer stack. In some aspects, the memory capacitor layer stack may be a planar layer stack; however, other shapes may be suitable as well (e.g., curved shapes, angled shapes, coaxially aligned shapes, and the like). Illustratively, the SPOC structure 120 may include planar electrodes, or, in other aspects, the SPOC structure 120 may be configured as a 3D capacitor including, for example, angled or curved electrodes.

The field-effect transistor structure 110 may include a gate structure 118, wherein the gate structure 118 may include a gate isolation 114 and a gate electrode 116. The gate structure 118 is illustrated exemplarily as a planar gate stack; however, it is understood that the planar configuration shown in FIG. 1A is an example, and other field-effect transistor designs may include a gate structure 118 with a non-planar shape (e.g., a trench gate transistor design, a vertical field-effect transistor design, or other designs, such as a fin-FET design).

The gate structure 118 may define a channel region 112 that may be provided in a semiconductor portion (e.g., in a semiconductor layer, in a semiconductor die, etc.). The gate structure 118 may allow for control of an electrical behavior (e.g., a resistance R) of the channel region 112 (e.g., a current flow in the channel region 112 may be controlled (allowed, increased, prevented, decreased, etc.)). In some aspects, the gate structure 118 may allow control (e.g., allow or prevent) of a source/drain current, $I_{SD}$, from a first source/drain region of the field-effect transistor structure 110 to a second source/drain region of the field-effect transistor structure 110 (the source/drains are provided in or adjacent to the channel but are not shown in FIG. 1A). The channel region 112 and the source/drain regions may be formed (e.g., via doping one or more semiconductor materials or by the use of intrinsically doped semiconductor materials) within a layer and/or over a layer. With respect to the operation of the field-effect transistor structure 110, a voltage may be provided at the gate electrode 116 to control the current flow, $I_{SD}$, in the channel region 112, and the current flow, $I_{SD}$, in the channel region 112 being caused by voltages supplied via the source/drain regions.

According to various aspects, the semiconductor portion (illustratively, where the channel region 112 may be formed), may be made of or may include silicon. However, other semiconductor materials of various types may be used in a similar way (e.g., germanium, Group III to V (e.g., SiC), or other types), including, for example, carbon nanotubes, organic materials (e.g., organic polymers), etc. In various aspects, the semiconductor portion may be a wafer made of silicon (e.g., p-type doped or n-type doped). In other aspects, the semiconductor portion may be a silicon on an insulator (SOI) wafer. In other aspects, the semiconductor portion may be provided by a semiconductor structure (e.g., by one or more semiconductor fins, one or more semiconductor nanosheets, one or more semiconductor nanowires, etc.) disposed at a carrier.

The gate electrode 116 may include an electrically conductive material, for example, a metal, a metal alloy, a degenerate semiconductor (e.g., a semiconductor material having a high level of doping that the material acts like a metal and not as a semiconductor), and/or the like. As an example, the gate electrode 116 may include or may be made of aluminum. As another example, the gate electrode 116 may include or may be made of polysilicon. According to various aspects, the gate electrode 116 may include one or more electrically conductive portions, layers, etc. The gate electrode 116 may include, for example, one or more metal layers (also referred to as a metal gate), one or more polysilicon layers (also referred to as poly-Si-gate), etc. A metal gate may include, for example, at least one work-function adaption metal layer disposed over the gate isolation 114 and an additional metal layer disposed over the work-function adaption metal layer. A poly-Si-gate may be, for example, p-type doped or n-type doped.

The gate isolation 114 may be configured to provide an electrical separation of the gate electrode 116 from the channel region 112 and further to influence the channel region 112 via an electric field generated by the gate electrode 116. The gate isolation 114 may include one or more electrically insulating layers, as an example. Some designs of the gate isolation 114 may include at least two layers including different materials (e.g., a first gate isolation layer (such as a first dielectric layer including a first dielectric material) and a second gate isolation layer (such as a second dielectric layer including a second dielectric material distinct from first dielectric material)).

As illustrated by the circuit equivalent in FIG. 1A, a (second) capacitance, $C_{FET}$, may be associated with the field-effect transistor structure 110. Illustratively, the channel region 112, the gate isolation 114, and the gate electrode 116 may have a capacitance, $C_{FET}$, associated therewith, originating from the more or less conductive regions (the channel region 112 and the gate electrode 116) separated from one another by the gate isolation 114. Further illustratively, the channel region 112 may be considered as a first capacitor electrode, the gate electrode 116 as a second capacitor electrode, and the gate isolation 114 as a dielectric medium between the two capacitor electrodes. The capacitance, $C_{FET}$, of the field-effect transistor structure 110 may define one or more operating properties of the field-effect transistor structure 110. The configuration of the field-effect transistor structure 110 (e.g., of the gate isolation 114) may be adapted according to a desired behavior or application of the field-effect transistor structure 110 during operation (e.g., according to a desired capacitance).

In general, the capacitance, C, of a planar capacitor structure may be expressed as, $C=\varepsilon_0\varepsilon_r A/d$, with $\varepsilon_0$ being the relative permittivity of the vacuum, A being the effective area of the capacitor, d being the distance of the two capacitor electrodes from one another, and $\varepsilon_r$ being the relative permittivity of the dielectric material disposed between two capacitor electrodes assuming that the whole gap between the two capacitor electrodes is filled with the dielectric material. It is noted that the capacitance of a non-planar capacitor structure or of a modified variant of a planar capacitor structure may be calculated based on equations known in the art.

In some aspects, the gate electrode 116 of the field-effect transistor structure 110 and the first electrode 126 of the SPOC structure 120 that is connected to the field-effect transistor structure 110 may be spatially separated from one another and electrically connected via a conductive connection (e.g., one or more metal lines). In other aspects, the gate electrode 116 of the field-effect transistor structure 110 and the first electrode 126 of the SPOC structure 120 may be in direct physical contact with one another or implemented as a single (shared) electrode.

The field-effect transistor structure 110 and the SPOC structure 120 together form a field-effect transistor based (e.g., capacitive) memory structure, as exemplarily shown in FIG. 1A. A gate 100*g* of the field-effect transistor based (e.g., capacitive) memory structure may be provided by the second electrode 128 or an additional electrode coupled to the second electrode 128. Various configurations of the SPOC structure 120 are described with reference to FIG. 1B to FIG. 1F.

According to various aspects, the memory structure 100 may provide or may be part of a memory cell. A memory cell may be provided, for example, by coupling a gate of a field-effect transistor structure with a (e.g., spontaneously polarizable) capacitive memory structure, or by integrating a memory structure in the gate structure of a field-effect transistor structure (as shown, in FIG. 1A for the field-effect transistor structure 110 and the SPOC structure 120). A memory cell may illustratively include a field-effect transistor structure and a SPOC structure coupled to or integrated in the field-effect transistor structure (optionally with one or more additional elements). In such a configuration, the capacitive memory element may be in a capacitive environment (e.g., disposed between two electrode layers or disposed between a channel of a field-effect transistor and an electrode layer (e.g., a gate electrode of the field-effect transistor)). In such a memory cell, the state (e.g., the polarization state) of the memory element influences the threshold voltage of the field-effect transistor structure (e.g., a first state of the memory element may be associated with a first threshold voltage, such as a low threshold voltage, and a second state of the memory element may be associated with a second threshold voltage, such as a high threshold voltage). A memory cell that includes a field-effect transistor structure and a SPOC structure may be referred to as a field-effect transistor based memory cell or a field-effect transistor based capacitive memory cell. It is noted that even though various aspects of a memory cell are described herein with reference to a field-effect transistor based capacitive memory structure (such as a FeFET), other memory structures may be suitable as well.

The field-effect transistor structure 110 and the SPOC structure 120 may be coupled (e.g., electrically connected) to one another such that a capacitive voltage divider is provided. The capacitive voltage divider formed by the field-effect transistor structure 110 and the SPOC structure 120 may allow adapting of the capacitances $C_{FET}$, $C_{CAP}$ of the respective capacitors to allow an efficient programming of the memory cell. The overall gate voltage required for switching the memory cell from one memory state into another memory state (e.g., from high threshold voltage state to low threshold voltage state, as described below), may become smaller in the case where the voltage distribution across the field-effect transistor structure 110 and the SPOC structure 120 is adapted such that more of the applied gate voltage drops across the memory layer of the SPOC structure 120 (e.g., across the memory element 124) than across the gate isolation of the field-effect transistor structure 110. The overall write voltage (illustratively, applied via nodes to which the field-effect transistor structure 110 and the SPOC structure 120 are connected) may thus be reduced by adapting the capacitive voltage divider. The voltage distribution may be determined by voltage divider calculations for a series connection of the capacitors.

That is, in the case that the capacitance, $C_{FET}$, of the field-effect transistor structure 110 is adapted (e.g., by providing a suitable gate isolation), a predefined fraction of the voltage applied to the series connection may drop across the SPOC structure 120. Accordingly, the electric field generated across the gate isolation of the field-effect transistor structure 110 underneath the SPOC structure 120 could be reduced if desired. This may lead to a reduced interfacial field stress, which may lead to a reduced wear out of the interface due to, for example, charge injection. Therefore, the reduced electric field generated across the gate isolation may lead to improved endurance characteristics of the memory cell, that is, to an increased amount of possible state reversals until the memory cell may lose or change its memory properties.

By increasing the capacitance $C_{FET}$ of the field-effect transistor structure 110 (e.g., by providing a gate isolation including a relatively thick layer of material with high dielectric constant), the depolarization field, $E_{Dep}$, of the spontaneously polarizable material of the memory element 124 may be reduced. The depolarization field may be expressed by the following set of equations, wherein the indices "FET" refer to the capacitor provided by the field-effect transistor structure 110, and the indices "CAP" refer to the capacitor provided by the SPOC structure 120, as described herein:

$$V_{FET} + V_{CAP} = 0,$$

$$D = \varepsilon_0 \varepsilon_{FET} E_{FET} = \varepsilon_0 \varepsilon_{CAP} E_{CAP} + P,$$

$$E_{CAP} \equiv E_{Dep} = -P\left(\varepsilon_0 \varepsilon_{CAP}\left(\frac{C_{FET}}{C_{CAP}} + 1\right)\right)^{-1}.$$

The depolarization field $E_{Dep}$ may be detrimental to data retention since, depending on its magnitude, it may depolarize the remanent-polarizable layer. However, the magnitude may be reduced by increasing the capacitance ratio $C_{FET}/C_{CAP}$. Accordingly, in the case where the capacitance $C_{FET}$ of the field-effect transistor structure 110 is increased, the depolarization field is reduced. This in turn improves the data retention of the memory cell.

According to various aspects, a threshold voltage of a field-effect transistor structure (and in a corresponding manner the threshold voltage of a field-effect transistor based memory cell) may be defined as a constant current threshold voltage (referred to as $V_{th(ci)}$). In this case, the constant current threshold voltage, $V_{th(ci)}$, may be a determined gate source voltage, $V_{GS}$, at which the drain current (referred to as $I_D$) is equal to a predefined (constant) current. The predefined (constant) current may be a reference current (referred to as $I_{D0}$) times the ratio of gate width (W) to gate length (L). The magnitude of the reference current, $I_{D0}$, may be selected to be appropriate for a given technology, e.g., 0.1 μA. In some aspects, the constant current threshold voltage, $V_{th(ci)}$, may be determined based on the following equation: $V_{th(ci)}=V_{GS}$ (at $I_D=I_{D0}\cdot W/L$).

A threshold voltage of a field-effect transistor structure (e.g., of the field-effect transistor structure 110) may be defined by the properties of the field-effect transistor structure (e.g., the materials, the doping, etc.), and it may thus be a (e.g., intrinsic) property of the field-effect transistor structure.

According to various aspects, a memory cell may have at least two distinct memory states associated therewith (e.g., with two distinct electrical conductivities or two distinct amounts of stored charge) to determine which of the at least two distinct states the memory cell is residing in. A memory cell including a field-effect transistor structure may include a first memory state (e.g., associated with a low threshold voltage state (referred to as LVT associated with the LVT memory state)), and a second memory state (e.g., associated with a high threshold voltage state (referred to as HVT state associated with the HVT memory state)). The high threshold voltage state may be, in some aspects, associated with a lower current flow during readout than with the low threshold voltage state. The low threshold voltage state may be an electrically conducting state (e.g., associated with a logic memory state "1", also referred to as a memory state or programmed state) and the high threshold voltage state may be an electrically non-conducting state or at least less conducting than the low threshold voltage state (e.g., associated with a logic memory state "0", also referred to as a memory state or erased state). However, the definition of the LVT state and the HVT state and/or the definition of a logic "0" and a logic "1" and/or the definition of "programmed state" and "erased state" may be selected arbitrarily. Illustratively, the first memory state may be associated with a first threshold voltage of the FET based memory cell, and the second memory state may be associated with a second threshold voltage of the FET based memory cell.

According to various aspects, the residual polarization of the memory element 124 (e.g., the polarization of the spontaneously-polarizable material of the memory element 124) may define the memory state a memory cell is residing in. According to various aspects, a memory cell may reside in a first memory state in the case that the memory element is in a first polarization state, and the memory cell may reside in a second memory state in the case that the memory element is in a second polarization state (e.g., opposite to the first polarization state). As an example, the polarization state of the memory element may determine the amount of charge stored in the SPOC structure 120. The amount of charge stored in the SPOC structure 120 may be used to define a memory state of the memory cell. The threshold voltage of a field-effect transistor structure may be a function of the polarization state of the memory element 124 (e.g., may be a function of the amount and/or polarity of charge stored in the SPOC structure 120). A first threshold voltage (e.g., a low threshold voltage $V_{L\text{-}th}$) may be associated with the first polarization state (e.g., with the first amount and/or polarity of stored charge), and a second threshold voltage *e.g., a high threshold voltage $V_{H\text{-}th}$) may be associated with the second polarization state (e.g., with the second amount and/or polarity of stored charge). A current flow from nodes, to which the field-effect transistor structure and the SPOC structure 120 are coupled, may be used to determine the memory state in which the memory cell is residing in.

According to various aspects, writing a memory cell or performing a write operation of a memory cell may include an operation or a process that modifies the memory state the memory cell is residing in from a (e.g., first) memory state to another (e.g., second) memory state. According to various aspects, writing a memory cell may include programming a memory cell (e.g., performing a programming operation of a memory cell), wherein the memory state the memory cell is residing in after programming may be called "programmed state". For example, programming an n-type FET based memory cell may modify the state the memory cell is residing in from the HVT state to the LVT state, whereas programming a p-type FET based memory cell may modify the state the memory cell is residing in from the LVT state to the HVT state. According to various aspects, writing a memory cell may include erasing a memory cell (e.g., performing an erasing operation of a memory cell), wherein the memory state the memory cell is residing in after the erasing may be called "erased state". For example, erasing an n-type FET based memory cell may modify the state the memory cell is residing in from the LVT state to the HVT state, whereas erasing a p-type FET based memory cell may modify the state the memory cell is residing in from the HVT state to the LVT state.

According to various aspects, a memory device may include a memory cell and a controller (e.g., a memory controller) configured to operate (e.g., read and write) the memory cell. According to various aspects, a memory cell arrangement may include a memory cell and a controller (e.g., a memory controller) configured to operate (e.g., read and write) the memory cell. It is noted that some aspects are described herein with reference to a memory cell of a memory device and/or with reference to a memory cell of memory cell arrangement; it is understood that a memory device and/or a memory cell arrangement may include a plurality of such described memory cells according to various aspects that can be operated in the same way by the controller (e.g., at the same time or in a time sequence). A memory cell arrangement may further include respective sets of control lines and voltage supply levels configured to operate the one or more memory cells of the memory device and/or the memory cell arrangement.

It is noted that a memory cell arrangement is usually configured in a matrix-type arrangement, wherein columns and rows define the addressing of the memory cells according to the control lines connecting respective subsets of memory cells of the memory cell arrangement along the rows and columns of the matrix-type arrangement. However, other arrangements may be suitable as well.

The memory cell or the memory cell arrangement described herein may be used in connection with any type of suitable controller (such as the controller 302) (e.g., a controller that may generate only two or only three different voltage levels) for writing the memory cell (e.g., for writing one or more memory cells of a memory cell arrangement). However, in other aspects, more than four different voltage levels may be used for operating (e.g., for reading) the memory cell or for operating one or more memory cells of a memory cell arrangement.

According to various aspects, the memory cell and the memory cell arrangement described herein may be configured as complementary metal oxide semiconductor (CMOS) compatible (e.g., including standard CMOS-materials only) and may require no special integration considerations (e.g., no special thermal budget which may avoid diffusion and/or contamination during manufacturing). CMOS compatible spontaneously polarizable materials may be used to implement the one or more memory cells based on, for example, $HfO_2$ and/or $ZrO_2$. Doped $HfO_2$ (e.g., $Si{:}HfO_2$ or $Al{:}HfO_2$) or other suitable spontaneously-polarizable materials may allow for an integration of the spontaneously polarizable layer via known integration schemes.

According to various aspects, a controller may be configured to provide one or more sets of voltage levels to operate a memory cell arrangement. According to various aspects, a writing operation may be provided based on only two voltage levels (e.g., a first supply voltage level VPP and a second supply voltage level VNN). In the case that the CMOS technology provides electrical access to the bulk, all bulks may be connected to VNN or a voltage significantly similar to VNN but such that no diode from the bulk to any source/drain region is forward biased.

Various aspects relate to a SPOC 120 in which the first electrode 126 and/or the second electrode 128 includes or consists of a (respective) electrically conductive electrode layer and a (respective) functional layer in direct contact with the memory element 124. A functional layer, as described herein, may include or may consist of an amorphous material. Illustratively, the SPOC structure 124 may include at least one amorphous functional layer in direct contact with the memory element 124 (e.g., with the spontaneously polarizable material of the memory element 124). In the case that the SPOC structure 120 includes more than one functional layer, the functional layers may include (e.g., consist of) the same amorphous material or different amorphous materials. A functional layer, as described herein, may include or may consist of a semi-conductive material. The semi-conductive material may be a semi-conductive metal oxide, such as semi-conductive tungsten oxide. According to various aspects, at least one functional layer may include or may consist of a semi-conductive and amorphous material.

The term "amorphous material" may describe a material having an amorphous structure (in some aspects also referred to as amorphous phase). An amorphous structure may be characterized by non-crystallinity. Crystalline materials may have crystallites (also referred to as crystalline grains or shortly grains) separated to each other by grain boundaries. A crystalline material may have a long range structural order (also referred to as long range periodicity) at least within each crystallite (e.g., over several (neighboring) crystallites). An amorphous material, being non-crystalline, may thus lack crystallites and grain boundaries and have no long range structural order. However, it is understood that an amorphous material may still exhibit other types of long range order, such as ferromagnetic or ferrimagnetic long range magnetic order. It is understood that an amorphous material may still exhibit some kind of short range order over short distances (e.g., over length scales of less than five nanometers). The amorphous phase may have a non-ordered atomic arrangement similar to a liquid phase. Usually, materials are crystalline in thermodynamic equilibrium; hence, an amorphous material may be a non-equilibrium material. The amorphous material may be generated by common non-equilibrium techniques, such as rapid solidification, plasma processing, vapor deposition, ion irradiation, etc. Due to energy introduced while processing, or energy introduced later on over time (e.g., by means of temperature even at room temperature), small crystallites may be generated within the substantially amorphous matrix of the amorphous material. It is also understood that an amorphous material may include crystallization nuclei. A crystallization nucleus may include, for example, up to 1000 atoms. Therefore, the term "amorphous material", as used herein, may refer to a material having a volume content of the amorphous phase of more than 75% (e.g., more than 90%, e.g., more than 95%). For example, more than 75% (e.g., more than 90%, e.g., more than 95%) of the volume of a cross section of the amorphous material may have the amorphous phase. This may be analyzed using electron diffraction (e.g., using selected area (electron) diffraction via a transmission electron microscope). The volume content of the amorphous phase within the amorphous material may also be analyzed using x-ray diffraction (XRD). To determine the volume of the amorphous material, x-ray reflection (XRR) may be employed to determine the thickness of the functional layer.

A functional layer including (e.g., consisting of) an amorphous material, as described herein, may refer to the layer directly contacting the memory element 124. It is noted that the respective electrode may include further layers not directly contacting the memory element 124. Amorphous materials may allow composition ranges which are not possible for crystalline (ordered) materials.

FIG. 1B to FIG. 1F each show an exemplary configuration of the SPOC structure 120 according to various aspects. For illustration, the configurations of the SPOC structure 120 are exemplarily shown for a planar configuration with planar layers. It is noted that other shapes may be suitable as well, such as curved shapes, angled shapes, and/or coaxially aligned shapes, as examples. In this case, any layer described herein may have a non-planar (e.g., curved) structure.

Figure 1B:
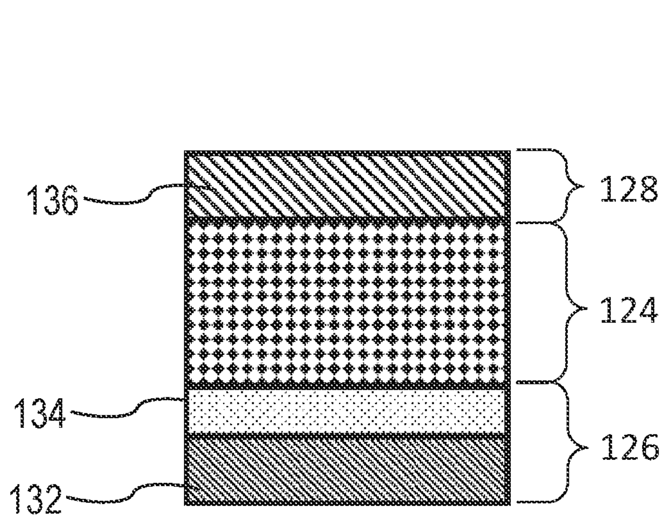
FIG. 1B to FIG. 1F each show an exemplary configuration of a spontaneously polarizable capacitor structure according to various aspects.

With reference to FIG. 1B, the first electrode 126 (in some aspects referred to as the bottom electrode) may include or may consist of a first electrically conductive electrode layer 132 and a first functional layer 134. The first functional layer 134 may include or may consist of a semi-conductive and/or amorphous material, as described herein. The second electrode 128 (in some aspects referred to as the top electrode) may include or may consist of a second electrically conductive electrode layer 136. The second electrically conductive electrode layer 136 may be disposed over the memory element 124. For example, during manufacturing, the second electrically conductive electrode layer 136 may be formed after forming the memory element 124. The first functional layer 134 may be disposed in direct contact with the memory element 124 (e.g., may be in direct physical contact with the memory element). It is noted that the first electrode 126 may include further layers. For example, during processing (e.g., manufacturing), a metal oxide (e.g., tungsten oxide) layer may be formed over the first electrically conductive electrode layer 132 using a non-equilibrium technique by which, however, an interface layer to the first electrically conductive electrode layer 132 exhibits a crystalline structure opposite to the otherwise amorphous matrix. In this case, the interface layer may be considered as an additional layer of the first electrode 126 and the layer having the amorphous matrix may form the first functional layer 134.

Figure 1C:
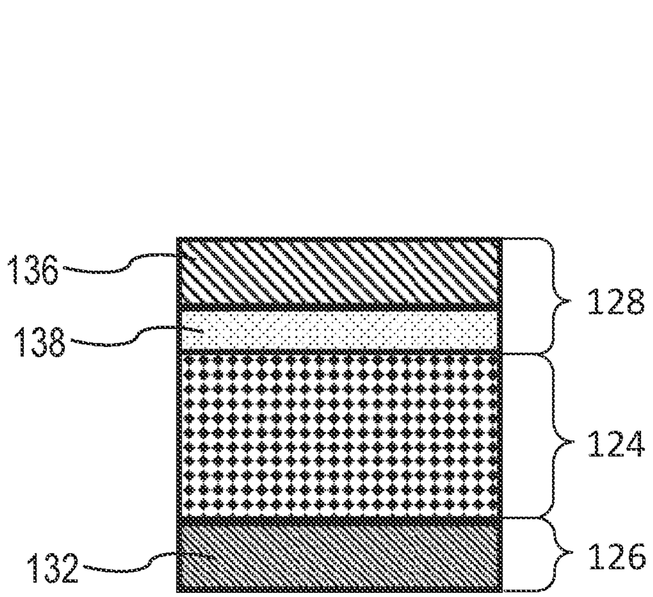

With reference to FIG. 1C, the second electrode 128 may include or may consist of the second electrically conductive electrode layer 136 and a second functional layer 138. The second functional layer 138 may include or may consist of a semi-conductive and/or amorphous material, as described herein. The second functional layer 138 may be disposed in direct contact with the memory element 124 (e.g., may be in direct physical contact with the memory element).

Figure 1D:
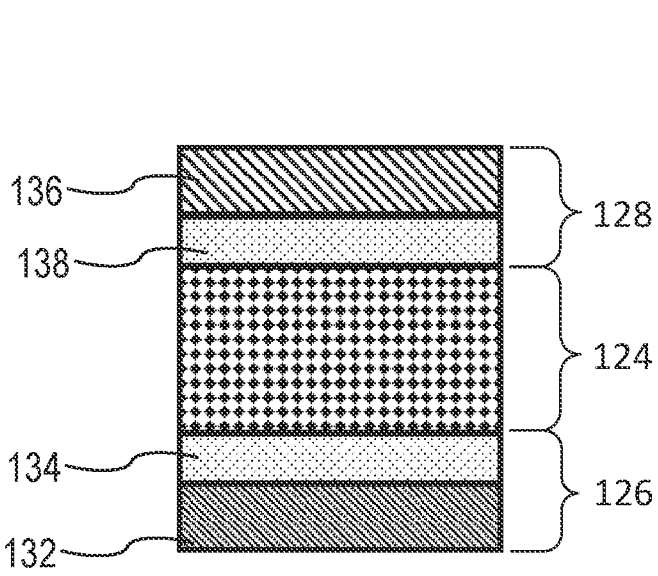

With reference to FIG. 1D, the SPOC structure 120 may include both, the first functional layer 134 (in some aspects referred to as the bottom functional layer) and the second functional layer 138 (in some aspects referred to as the top functional layer). The first functional layer 134 and the second functional layer 138 may include or may consist of the same (e.g., semi-conductive and/or amorphous) functional material. The first functional layer 134 and the second functional layer 138 may include or may consist of different (e.g., semi-conductive and/or amorphous) functional materials. For example, the first functional layer 134 may include or may consist of a semi-conductive material and the second functional layer 138 may include or may consist of an amorphous material, or vice versa. The first functional layer 134 and the second functional layer 138 may include or may consist of the same functional material, but may have different stoichiometry of the functional material.

According to various aspects, the functional material of the first functional layer 134 and/or the second functional layer 138 may be a metal oxide. This metal oxide may be a semi-conductive and/or amorphous metal oxide. The functional material of the first functional layer 134 and/or the second functional layer 138 may include or may consist of a non-stoichiometric metal oxide. The first functional layer 134 and/or the second functional layer 138 may include (e.g., semi-conductive and/or amorphous) tungsten (W). For example, the first functional layer 134 and/or the second functional layer 138 may include or may consist of (e.g., non-stoichiometric) (e.g., semi-conductive and/or amorphous) tungsten oxide, $WO_x$. It is understood that the conductivity of tungsten oxide, $WO_x$, may depend on the oxygen content within the tungsten oxide (hence, on "x"). For example, the tungsten oxide may be semi-conductive in the case that "x" is substantially equal to 3 ($x \approx 3$). In the case that the oxygen content is lower than substantially x=3, the tungsten oxide may be conductive or isolating (e.g., dependent on other dopants). For example, the conductivity of tungsten oxide may increase with decreasing x-value.

The material of the first electrically conductive electrode layer 132 and/or the second electrically conductive electrode layer 136 may have an electrical conductivity greater than $10^6$ S/m at a temperature of 20° C. The first electrically conductive electrode layer 132 and/or the second electrically conductive electrode layer 136 may have a thickness less than 10 nm (e.g., less than 5 nm, or less than 2 nm). The coefficient of thermal expansion of the first electrically conductive electrode layer 132 and/or the second electrically conductive electrode layer 136 may be below 7 ppm.

The first electrically conductive electrode layer 132 and/or the second electrically conductive electrode layer 136 may include or may consist of a metal, such as Platinum (Pt), Iridium (Jr), Rhenium (Re), Rhodium (Rh), Palladium (Pd), Ruthenium (Ru), Titanium (Ti), Osmium (Os), Molybdenum (Mo), Chromium (Cr), Tungsten (W), Aluminum (Al), Gold (Au), and/or Cobalt (Co).

The first electrically conductive electrode layer 132 and/or the second electrically conductive electrode layer 136 may include or may consist of a metal nitride. The metal nitride may be, for example, a titanium-based alloy (e.g., TiN, e.g., Ti—C—N, e.g., Ti—Al—N, e.g., TiN—TaN) or tantalum-based alloy (e.g., TaN, e.g., Ta—C—N, e.g., TaN—TiN).

The first electrically conductive electrode layer 132 and/or the second electrically conductive electrode layer 136 may include or may consist of an oxidation resistant metal (e.g., a noble metal). The oxidation resistant metal may have an electronegativity greater than 1.85 on the Pauling scale. The oxidation resistant metal may have a melting temperature greater than 1450° C. This may reduce an oxidation of the interface of the respective electrically conductive electrode layer. The oxidation resistant metal may include (e.g., consist of), for example, tungsten, platinum, iridium, ruthenium, palladium, osmium, rhodium, molybdenum, cobalt, rhenium, or nickel. According to various aspects, the first electrically conductive electrode layer 132 and/or the second electrically conductive electrode layer 136 may have a work function of the oxidation resistant metal equal to or greater than 5 eV. According to various aspects, using oxidation resistant metal electrode(s) in combination with a spontaneously polarizable material which includes transition-metal-oxides (e.g., as a high-k capacitor dielectric) may suppress a charge injection due to the work function equal to or greater than 5 eV and a comparatively high band-offset. The band-offset may be a conduction band-offset for electrons (between Fermi-level of the electrode and the conduction band of the dielectric layers) or a valance band offset for holes (between Fermi-level of the electrode and the valence band of the dielectric layers).

The first electrically conductive electrode layer 132 and/or the second electrically conductive electrode layer 136 may include or may consist of a metal oxide. For example, both, the first electrically conductive electrode layer 132 and the first functional layer 134 may consist of a metal oxide. However, the first electrically conductive electrode layer 132 may have a crystalline structure whereas the first functional layer 134 may have an amorphous structure and/or the first electrically conductive electrode layer 132 may be electrically conductive whereas the first functional layer 134 may be electrically semi-conductive. For example, both, the second electrically conductive electrode layer 136 and the second functional layer 138 may consist of a metal oxide. However, the second electrically conductive electrode layer 136 may have a crystalline structure whereas the second functional layer 138 may have an amorphous structure and/or the second electrically conductive electrode layer 136 may be electrically conductive whereas the second functional layer 138 may be electrically semi-conductive.

According to various aspects, a work function of a functional layer (e.g., the first functional layer 134 or the second functional layer 138) may be greater than a work function of the associated electrically conductive electrode layer (e.g., the first electrically conductive electrode layer 132 in the case of the first functional layer 134 and the second electrically conductive electrode layer 136 in the case of the second functional layer 138). The greater work function of the functional layer may suppress a charge injection from the associated electrically conductive electrode layer into the functional layer. This may increase the electronic properties of the capacitive memory structure (e.g., reducing a leakage current associated with the capacitive memory structure). For example, the initialization processes for initial polarization may be sped up. This may allow a faster wake-up of the memory cell having the SPOC structure 120.

The spontaneously polarizable material (e.g., HZO) of the memory element 124 may exhibit the spontaneously polarizable properties only in the crystalline phase. According to some aspects, the spontaneously polarizable material may be deposited already in the crystallized state. According to other aspects, the spontaneously polarizable material may be deposited substantially amorphous and crystallized afterwards. Hence, the material of the memory element 124 herein may be referred to as spontaneously polarizable material even in the amorphous state prior to exhibiting the spontaneously polarizable properties responsive to crystallization.

The spontaneously polarizable material (e.g., HZO) of the memory element 124 may be crystallized by annealing (e.g., thermally annealing). The annealing may include a furnace annealing, a flash-lamp annealing, and/or a laser annealing. The annealing may be carried out in an inert gas atmosphere (e.g., nitrogen or argon) at any suitable pressure (e.g., at atmospheric pressure, at a pressure below atmospheric pressure, or at a pressure above atmospheric pressure). In some aspects, the annealing may be carried out in a vacuum. A vacuum in a processing chamber (e.g., for depositing a material and/or for annealing a material) may be provided in a pressure range below 50 mbar. According to various aspects, the memory element 124 may be annealed using a laser annealing and/or a flash-lamp annealing with local temperatures in a range from about 1500° C. to about 1850° C. The local temperatures in the range from about 1500° C. to about 1850° C. may result in homologous temperature, $T_H$, of the capacitive memory structure given by a temperature, T, over a melting temperature of the one or more transition-metal-oxides, $T_{melt}$, in the range from about 0.6 to about 0.7 (or greater than 0.7). For example, it may be possible to crystallize the HZO into the ferroelectric phase by annealing at temperatures in a range from about 300° C. to about 400° C. It is noted that the SPOC structure 120 described herein may include one or more of the amorphous functional layers (e.g., the first functional layer 134 and/or the second functional layer 138) in the state in which the memory element 124 has its spontaneously polarizable properties. Hence, the SPOC structure 120 may be configured such that the one or more functional layers are amorphous even after crystallizing (e.g., via thermal annealing) the spontaneously polarizable material.

Figure 2:
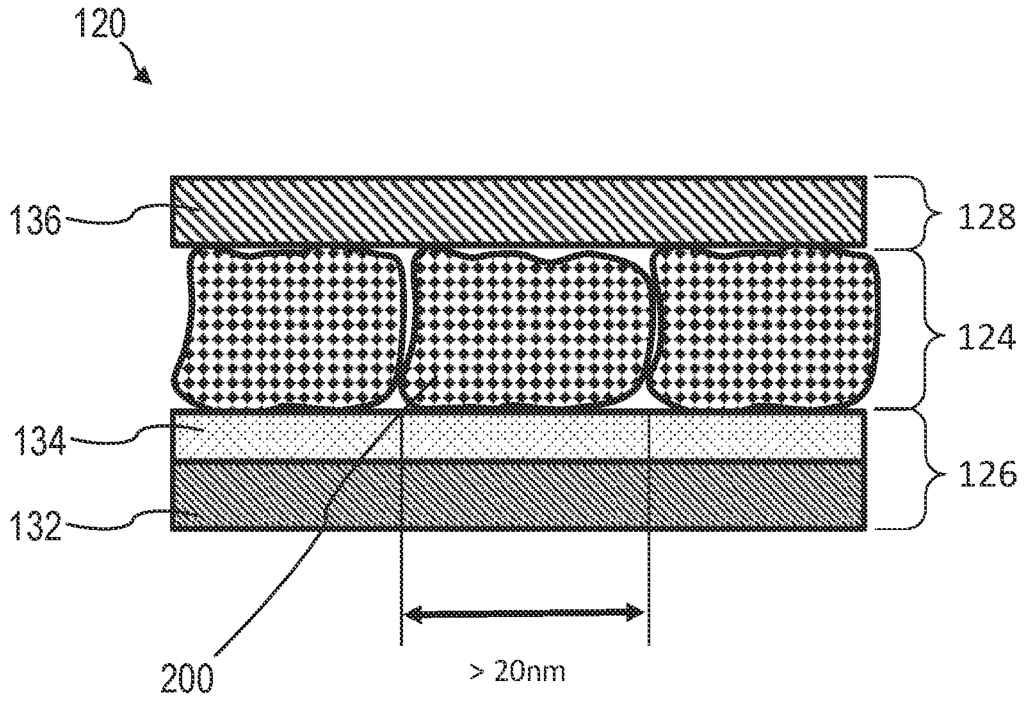
FIG. 2 shows a spontaneously polarizable capacitor structure having a crystalline memory element according to various aspects.

An amorphous functional layer (e.g., the first functional layer 134 or the second functional layer 138) may allow the (e.g., initially amorphously deposited) spontaneously polarizable material of the memory element 124 to crystallize such that the crystalline spontaneously polarizable material has a predefined crystallographic texture (e.g., a (001)-texture or a (111)-texture) after crystallization. Due to the lack of crystallites and, thus, grain boundaries of the amorphous functional material in direct contact with the spontaneously polarizable material of the memory element 124, no discontinuities may be introduced into the spontaneously polarizable material during crystallization (e.g., thermal annealing). This may allow the crystallites of the spontaneously polarizable material to grow to larger crystallite sizes (also referred to as grain size). The vertical crystallite size is limited by the thickness of the memory layer 124. The memory layer 124 may have a thickness in the range from about 4 nm to about 20 nm. The amorphous functional layer(s) may allow the (e.g., initially amorphously deposited) spontaneously polarizable material of the memory element 124 to crystallize such that the crystalline spontaneously polarizable material has a crystallite height (perpendicular to the respective functional layer) substantially equal to the thickness of the memory element 124. According to various aspects, the amorphous functional layer(s) may allow the (e.g., initially amorphously deposited) spontaneously polarizable material of the memory element 124 to crystallize such that the crystalline spontaneously polarizable material has a crystallite width (parallel to the respective functional layer) greater than 20 nm. Crystallites having a height substantially equal to the thickness of the memory element 124 and having a width greater than 20 nm, as achieved by means of the amorphous functional layer(s), are exemplarily shown in FIG. 2. As an example, the spontaneously polarizable material portion of one memory cell of a plurality of memory cells may have a width of about 10 nm. Hence, crystallites having a width greater than 20 nm significantly increase the probability that the memory element of a memory cell is provided by a single crystallite (or a maximum of two crystallites). Therefore, the properties of all of the plurality of memory cells may be substantially the same which improves the quality of the overall memory device including the plurality of memory cells.

The crystallized spontaneously polarizable material may be polycrystalline including a plurality of crystallites, and the crystallites may have the predefined crystallographic texture, as achieved by means of the amorphous functional layer(s). As an example, a majority of the crystallites (e.g., at least 50%, e.g., at least 75%, e.g., at least 90% of the crystallites) may be oriented along the same direction and therefore define a crystallographic texture. The term "texture", as used herein, may describe a crystallographic texture as a property of a material or of a layer including a material. The crystallographic texture may be related to a distribution of crystallographic orientations of crystallites of a polycrystalline material. The crystallographic texture may be described by an orientation distribution function (ODF). A crystallographic texture of a layer, as referred to herein, may describe a preferred orientation of the crystallites of a polycrystalline material with reference to a surface of the layer. A crystallographic texture of a layer, as referred to herein, may describe a preferred orientation of the crystallites of a polycrystalline material with reference to a direction of an external electric field caused by a voltage applied to electrodes contacting the layer. In other words, a material or layer consisting of crystallites may have no texture in the case that the orientations of the crystallites are randomly distributed. The material or layer may be regarded as a textured material or layer in the case that the orientations of the crystallites show one or more preferred directions. For example, a (001)-texture of the spontaneously polarizable memory layer may describe that most of the crystallites of the polycrystalline material that forms at least part of the spontaneously polarizable memory layer are oriented with their (001)-lattice planes along a direction perpendicular to the (e.g., upper) surface of the spontaneously polarizable memory layer. For example, a (001)-texture of the spontaneously polarizable material of the memory element 124 may describe that most of the crystallites of the polycrystalline material that forms at least part of the spontaneously polarizable material are oriented with their (001)-lattice planes along a direction perpendicular to a growth direction associated with the spontaneously polarizable material. As another example, a (111)-texture of the spontaneously polarizable material of the memory element 124 may describe that most of the crystallites of the polycrystalline material that forms at least part of the spontaneously polarizable material are oriented with their (111)-lattice planes along a direction perpendicular to the (e.g., upper) surface of the spontaneously polarizable material. For example, a (111)-texture of the spontaneously polarizable material may describe that most of the crystallites of the polycrystalline material that forms at least part of the spontaneously polarizable memory layer are oriented with their (111)-lattice planes along a direction perpendicular to a growth direction associated with the spontaneously polarizable memory layer. The (001)-texture may be a (001)-fiber-texture or a (001)-biaxial-texture. The (111)-texture may be a (111)-fiber-texture or a (111)-biaxial-texture. In general, the crystallographic texture may be described by the orientation distribution function (ODF), wherein x-ray diffraction patterns (e.g., pole-figure measurements or theta-2theta x-ray diffraction measurements with a scattering vector in plane-normal direction, such as perpendicular to a surface of electrodes of a planar capacitive memory structure) or other suitable measurements (e.g., based on transmission electron microscopy, electron backscatter diffraction (EBSD), or transmission Kikuchi diffraction (TKD)) may be used to determine the orientation of the crystalline grains of the material.

It was found that a random orientation of crystallites in a remanent polarizable material (e.g., in a ferroelectric material) of the memory element 124 may result in a remanent polarization, $P_r$, of about only 50% of the maximum remanent polarization even if the remanent polarizable phase fraction (e.g., the ferroelectric phase fraction) is about 100%. Furthermore, it was found that the grains in the memory element 124 may give rise to ionic defects and/or electronic defects. Furthermore, it was found that, in a ferroelectric material, domain boundaries can be charged and/or be conductive depending on the polarization configuration and on whether they are parallel or inclined to the polarization direction. The generating of the predefined crystallographic texture of the spontaneously polarizable material allows for an efficient polarization behavior of the spontaneously polarizable material. A polarization capability of a material (dielectric, spontaneous and remanent polarization) may be analyzed using capacity measurements (e.g., a spectroscopy), for example via a static (C-V) and/or time-resolved measurement or by polarization-voltage (P-V)) or positive-up-negative-down (PUND) measurements.

Figure 1E:
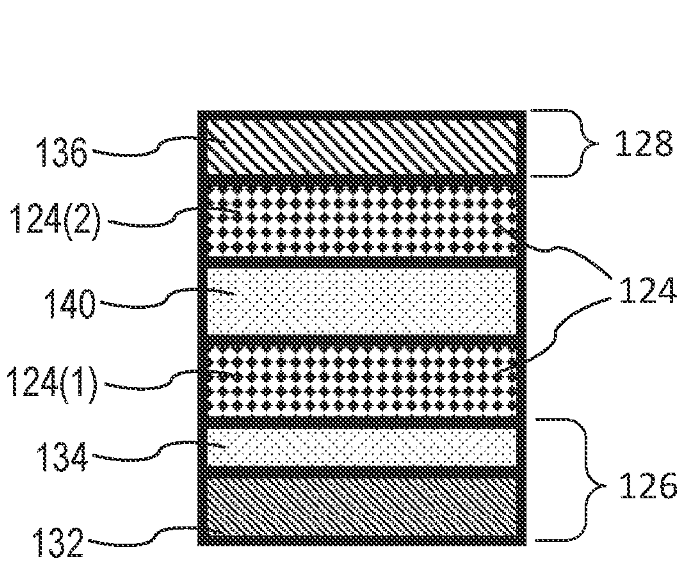
Figure 1F:
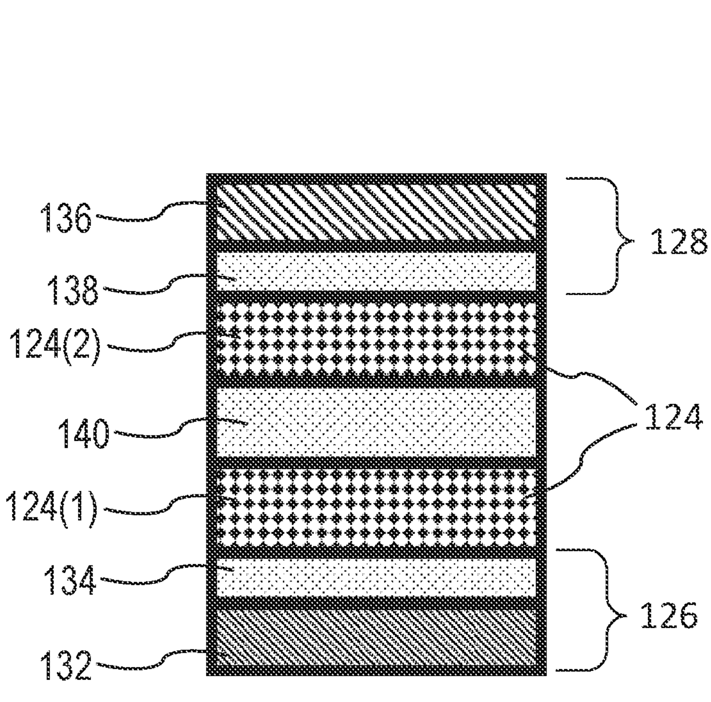

With reference to FIG. 1E and FIG. 1F, an additional functional layer 140 may be disposed between layers of the memory element 124. As shown, the memory element 124 may include a first spontaneously polarizable layer 124(1) and a second spontaneously polarizable layer 124(2). The first spontaneously polarizable layer 124(1) and the second spontaneously polarizable layer 124(2) may include or may consist of the spontaneously polarizable material of the memory element 124. The additional functional layer 140 may be disposed between the first spontaneously polarizable layer 124(1) and the second spontaneously polarizable layer 124(2). The additional functional layer 140 may define the crystallite height of the crystallites within the crystalline first spontaneously polarizable layer 124(1) and/or the crystalline second spontaneously polarizable layer 124(2). The individually reduced thickness of the first spontaneously polarizable layer 124(1) and the crystalline second spontaneously polarizable layer 124(2) as compared to their total thickness may further increase the crystal width of their crystallites. Optionally, the SPOC structure 120 may include more than one additional functional layer; each of the additional functional layers may be disposed between two consecutive spontaneously polarizable layers of the memory element 124. Each additional functional layer may be disposed in direct contact with spontaneously polarizable material of the memory element 124. Each additional functional layer described herein may be configured as described with reference to the first functional layer 134 and/or the second functional layer 138. It is understood that features described with reference to the first functional layer 134 also apply correspondingly to the second functional layer 138, and vice versa.

According to various aspects, the SPOC structure 120 may include the additional functional layer 140, but not the first functional layer 134 and not the second functional layer 138.

According to various aspects, each functional layer (e.g., the first functional layer 134, the second functional layer 138, and/or the additional functional layer 140) may be configured to allow a transfer of anions (e.g., oxygen anions) of the spontaneously polarizable material of the memory element 124 from the spontaneously polarizable material into the functional layer and also from the functional layer into the spontaneously polarizable material. The SPOC structure 120 may be configured such that the transfer of the anions from the spontaneously polarizable material into the functional layer, and vice versa, can be controlled by application of an electric field. This is exemplarily illustrated in FIG. 3A and FIG. 3B for a SPOC structure 120 as described with reference to FIG. 1B, and in FIG. 4A and FIG. 4B for a SPOC structure 120 as described with reference to FIG. 1D. A memory device 300, 400 or a memory cell arrangement may include one or more memory cells and each memory cell of the one or more memory cells may include the SPOC structure 120. The memory device 300, 400 may include a controller 302. The controller 302 may be configured to operate the respective memory cell. For example, the controller 302 may be configured to write and/or read the respective memory cell. The controller 302 may be configured to apply a first electric field (also referred to as a write electric field) via the first electrode 126 and the second electrode 128 to write the memory cell into one of at least two memory states. The controller 302 may be configured to apply a second electric field (also referred to as a read electric field) via the first electrode 126 and the second electrode 128 to read the memory state of the memory cell. According to various aspects, the controller 302 may be configured to apply a third electric field via the first electrode 126 and the second electrode 128 to change the material properties of the spontaneously polarizable material of the memory element 124. The controller 302 may be configured to apply an electric field on the memory element 124 by applying an associated voltage on the first electrode 126 and/or second electrode 128. Optionally, the electric field strength of the third electric field may be greater than the electric field strength of the first electric field and the electric field strength of the second electric field. It is understood that the controller 302 may be configured to apply one or more voltages to apply the respective electric field. A write voltage for applying the first electric field and a read voltage for applying the second electric field may be different from each other (e.g., in the case of a FeFET architecture) or may be the same (e.g., in the case of a FRAM architecture).

As an example, the memory cell may include the first functional layer 134 and no second functional layer 138. The memory cell may be written into one of the at least two memory states by applying a first write voltage of +2V to the first electrode 126 which may trigger a transfer of anions (e.g., oxygen anions) from the spontaneously polarizable material of the memory element 124 into the functional material of the first functional layer 134. The memory cell may be written into the other one of the at least two memory states by applying a second write voltage of +2V to the second electrode 128 which may trigger a transfer of anions (e.g., oxygen anions) from the functional material of the first functional layer 134 into the spontaneously polarizable material.

As another example, the memory cell may include the first functional layer 134 and the second functional layer 138. The memory cell may be written into one of the at least two memory states by applying a first write voltage of +2V to the second electrode 128 which may trigger a transfer of anions (e.g., oxygen anions) from the spontaneously polarizable material of the memory element 124 into the functional material of the second functional layer 138. The memory cell may be written into the other one of the at least two memory states by applying a second write voltage of +2V to the first electrode 126 which may trigger a transfer of anions (e.g., oxygen anions) from the functional material of the second functional layer 138 via the spontaneously polarizable material of the memory element 124 into the functional material of the first functional layer 134.

For reading the memory cell, e.g., +2V are applied to the second electrode 128 and depending on the state the memory capacitor is in, it is either read-out destructively (e.g., by detecting a large switching current) or non-destructively (e.g., by detecting only a smaller current).

The changed material properties of the spontaneously polarizable material of the memory element 124 may result in a change of the polarization/voltage drop characteristic or polarization/electric field characteristic of the spontaneously polarizable material. For example, a shape of the polarization (P) vs. electric field (E) hysteresis loop (also referred to as P-E-hysteresis loop) may be changed. Illustratively, the application of an (e.g., the third) electric field may induce a transfer of anions between the spontaneously polarizable material of the memory element 124 and the functional layer resulting in a changed shaped of the P-E-hysteresis loop. Illustratively, the transfer of anions may induce a shift of a position of the memory window. The changed material properties may be determined by measuring a current/voltage characteristic (e.g., based on switching voltages and/or switching currents) in the case of a transistor based memory cell.

Figure 5A:
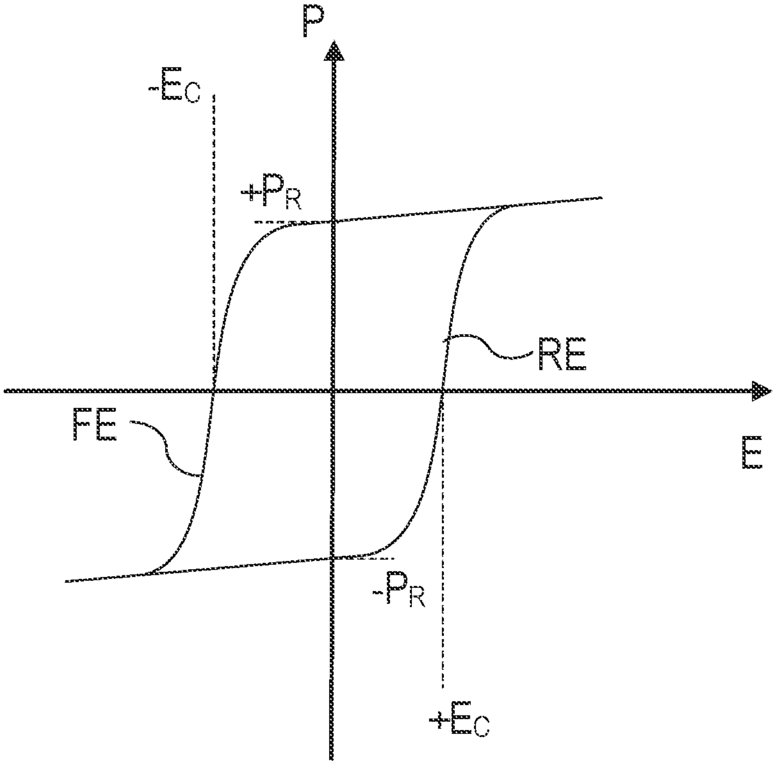
FIG. 5A shows a polarization vs. electric field hysteresis loop.
Figure 5B:
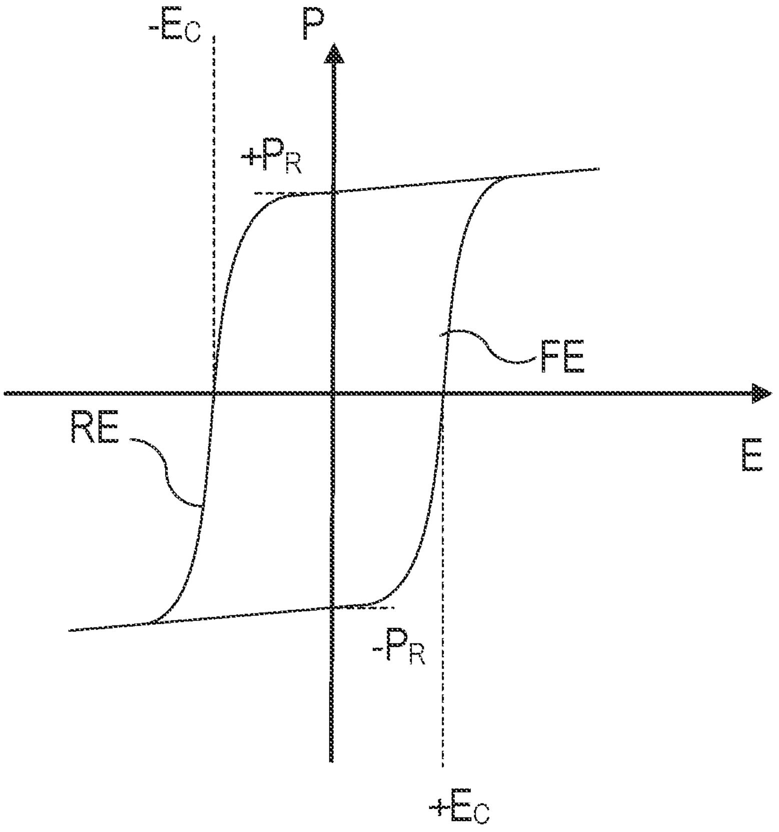
FIG. 5B to FIG. 5I each show an exemplary change of this polarization vs. electric field hysteresis loop caused by a structural change of the memory element.
Figure 5C:
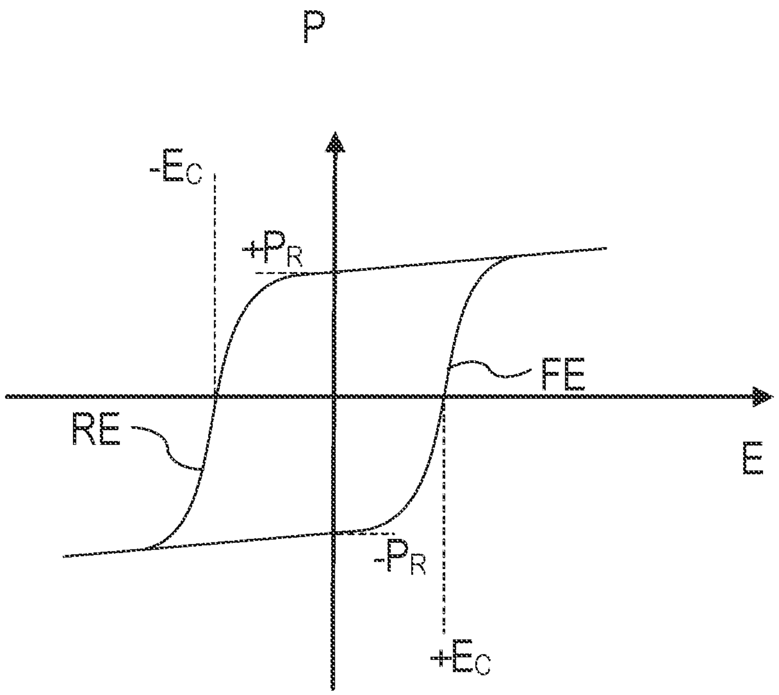
Figure 5D:
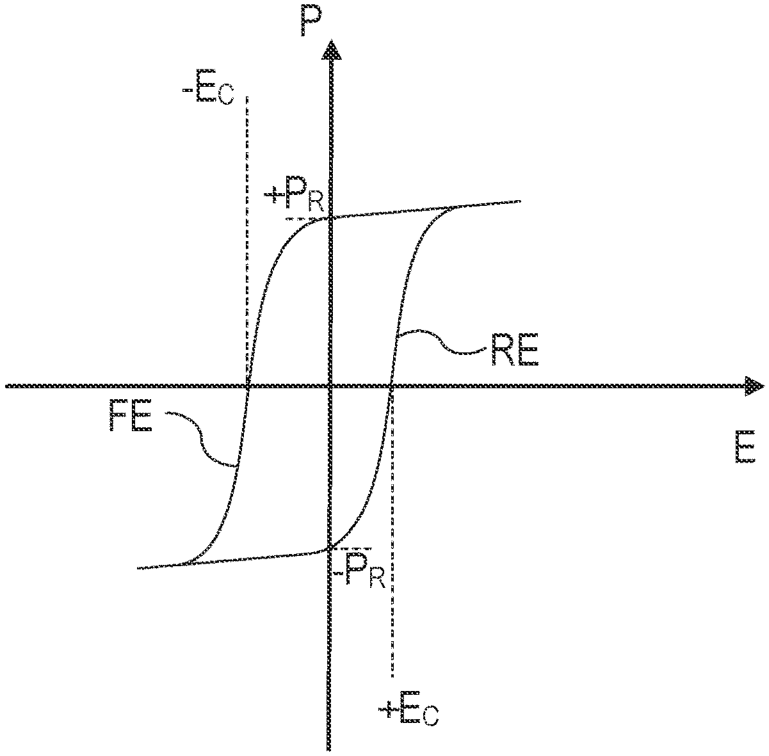
Figure 5E:
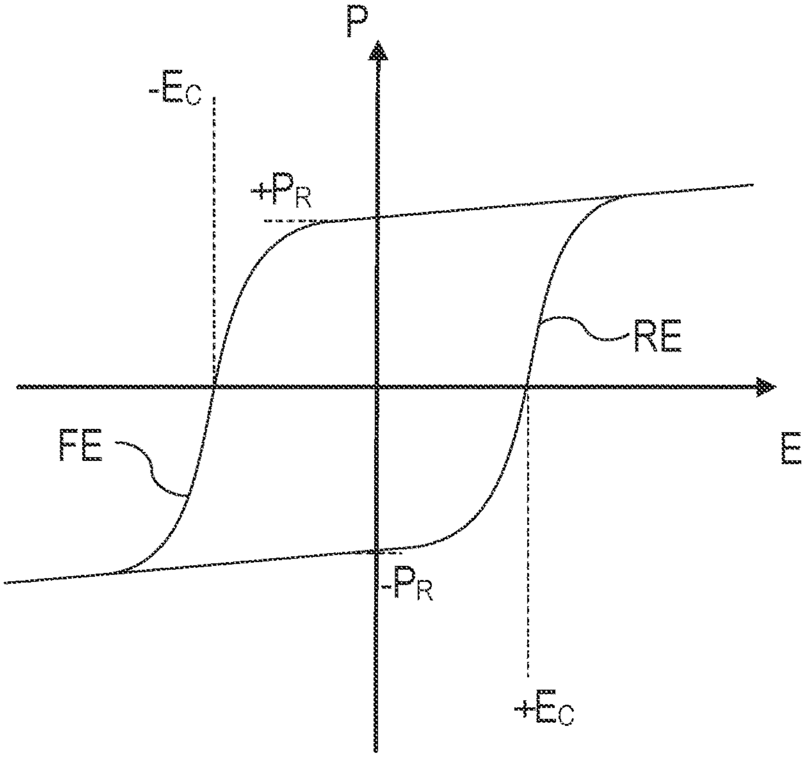
Figure 5F:
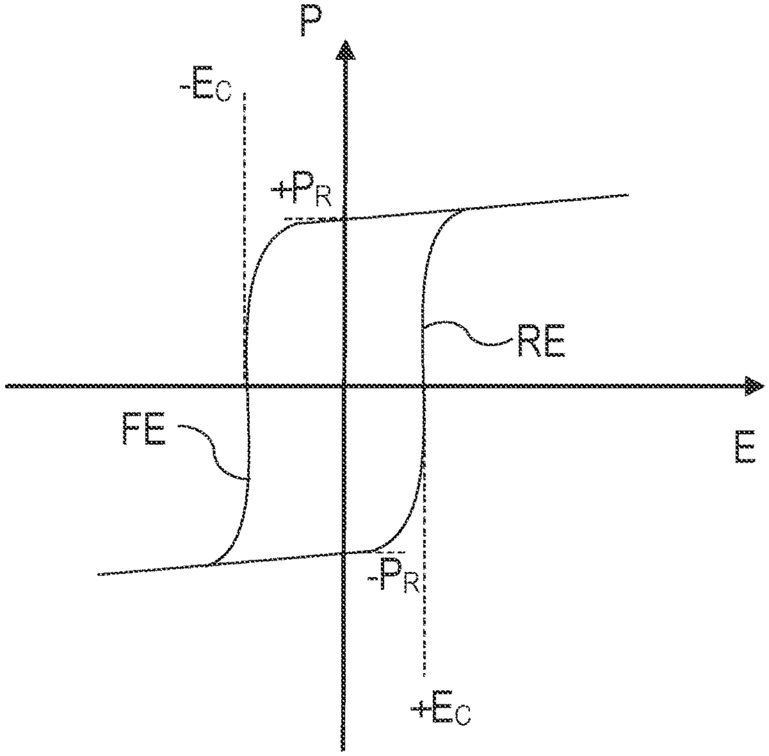
Figure 5G:
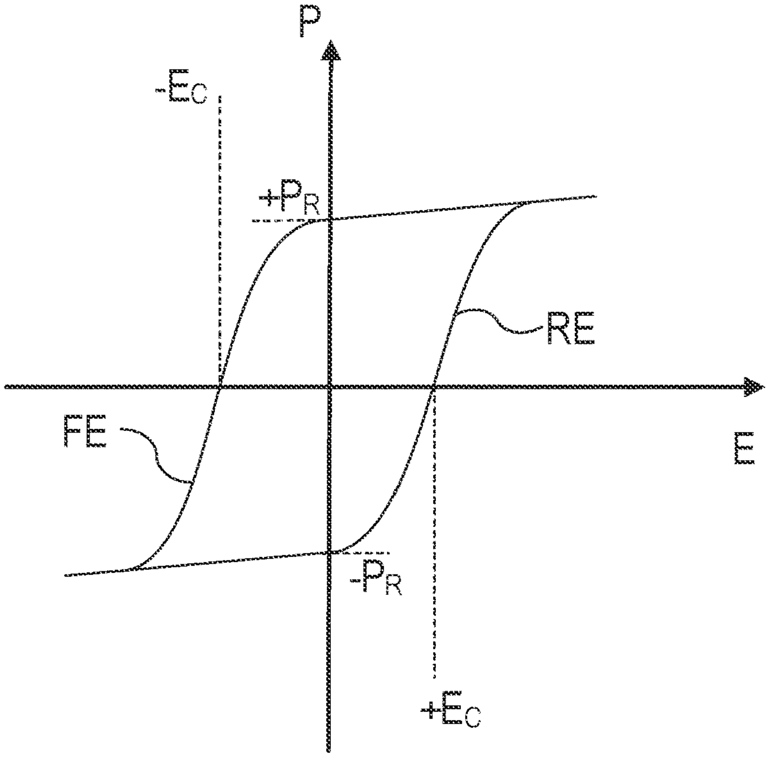
Figure 5H:
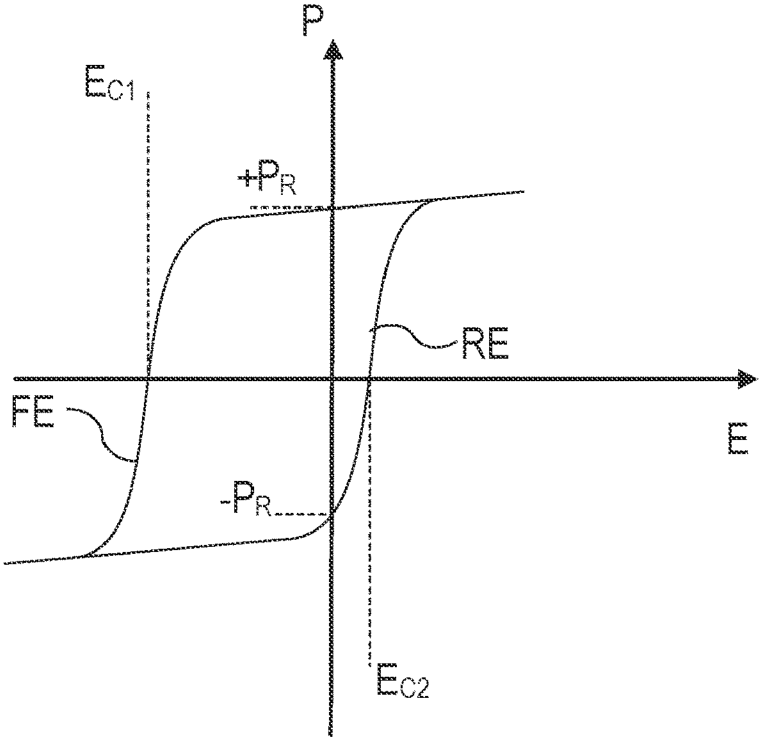
Figure 5I:
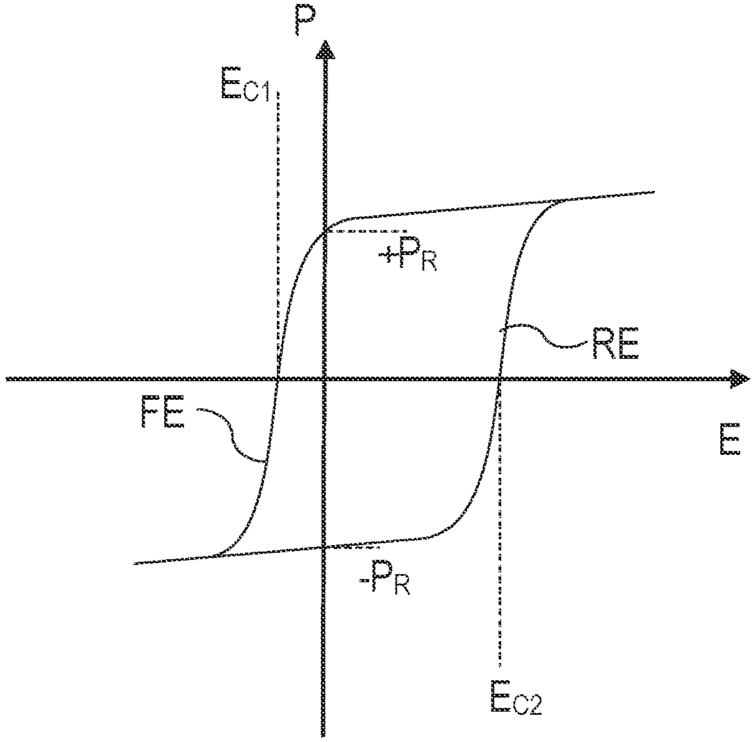

An exemplary symmetric P-E-hysteresis loop is shown in FIG. 5A. A P-E-hysteresis loop may be characterized by an electric coercive field $E_C$ (with a negative coercive field $-E_C$ and a positive coercive field $+E_C$), a (e.g., maximum) remanent polarization $P_R$ (with a negative remanent polarization $-P_R$ and a positive remanent polarization $+P_R$), a slope of the rising edge (RE), and a slope of the falling edge (FE). As an example, at least one of these parameters of the P-E-hysteresis loop may be changed responsive to applying the third electric field. It is understood that more than one of these parameters may be changed. Exemplary changes as induced by the transfer of anions between the spontaneously polarizable material of the memory element 124 and the functional layer are shown in FIG. 5B to FIG. 5L the (e.g., maximum) remanent polarization $P_R$ may be increased (FIG. 5B) or decreased (FIG. 5C); electric coercive field $E_C$ may be decreased (FIG. 5D) or increased (FIG. 5E); the slope of the rising edge (RE) and/or the slope of the falling edge (FE) may be increased (FIG. 5F) or decreased (FIG. 5G); and the position of the P-E-hysteresis loop may be shifted to a negative electric field (FIG. 5H, with $|E_{C1}|>|E_{C2}|$) or a positive electric field (FIG. 5I, with $|E_{C1}|<|E_{C2}|$).

In the following, the transfer of the anions is described in more detail.

Figure 3A:
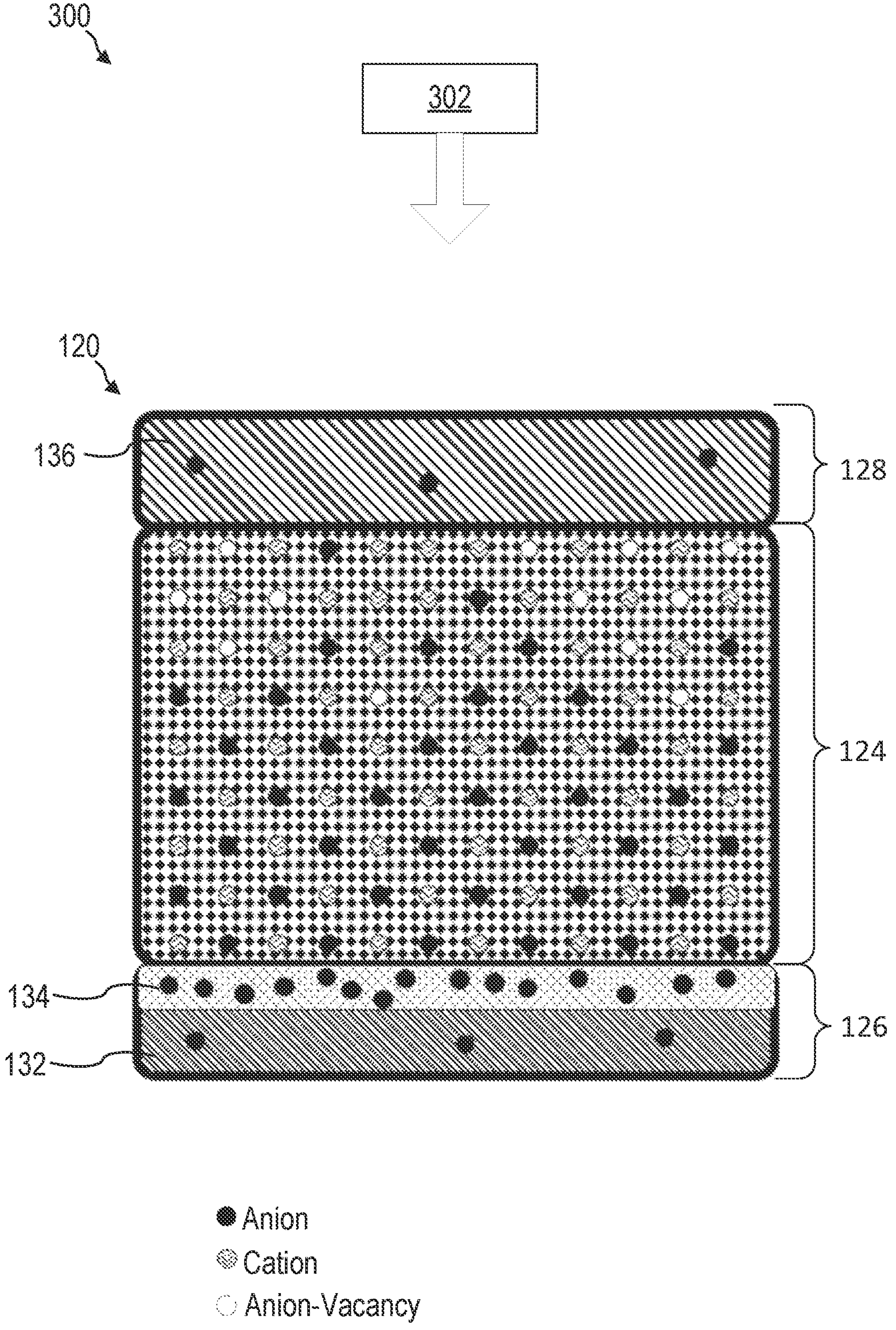
FIG. 3A and FIG. 3B show a spontaneously polarizable capacitor structure after the application of a first electric field and a second electric field, respectively.

With reference to FIG. 3A, the application of a negative bias on the second electrode 128 may induce a transfer of anions from the spontaneously polarizable material of the memory element 124 into the functional material of the first functional layer 134. This may lead to anion vacancies within the spontaneously polarizable material of the memory element 124. Hence, the transfer of the anions from the spontaneously polarizable material of the memory element 124 into the functional material of the first functional layer 134 may result in a reduced anion content within the spontaneously polarizable material and an increased anion content of the first functional layer 134.

The reduced anion content within the spontaneously polarizable material may cause a change of the material properties of the spontaneously polarizable material, thereby changing the P-E-hysteresis loop. According to various aspects, the spontaneously polarizable material may be configured to change its crystal structure as a function of an amount of anions. Hence, the reduced anion content within the spontaneously polarizable material may cause a change of the crystal structure of the spontaneously polarizable material of the memory element 124. It is understood that the crystal structure of the spontaneously polarizable material directly influences other material properties of the spontaneously polarizable material and, thus, the P-E-hysteresis loop.

Figure 3B:
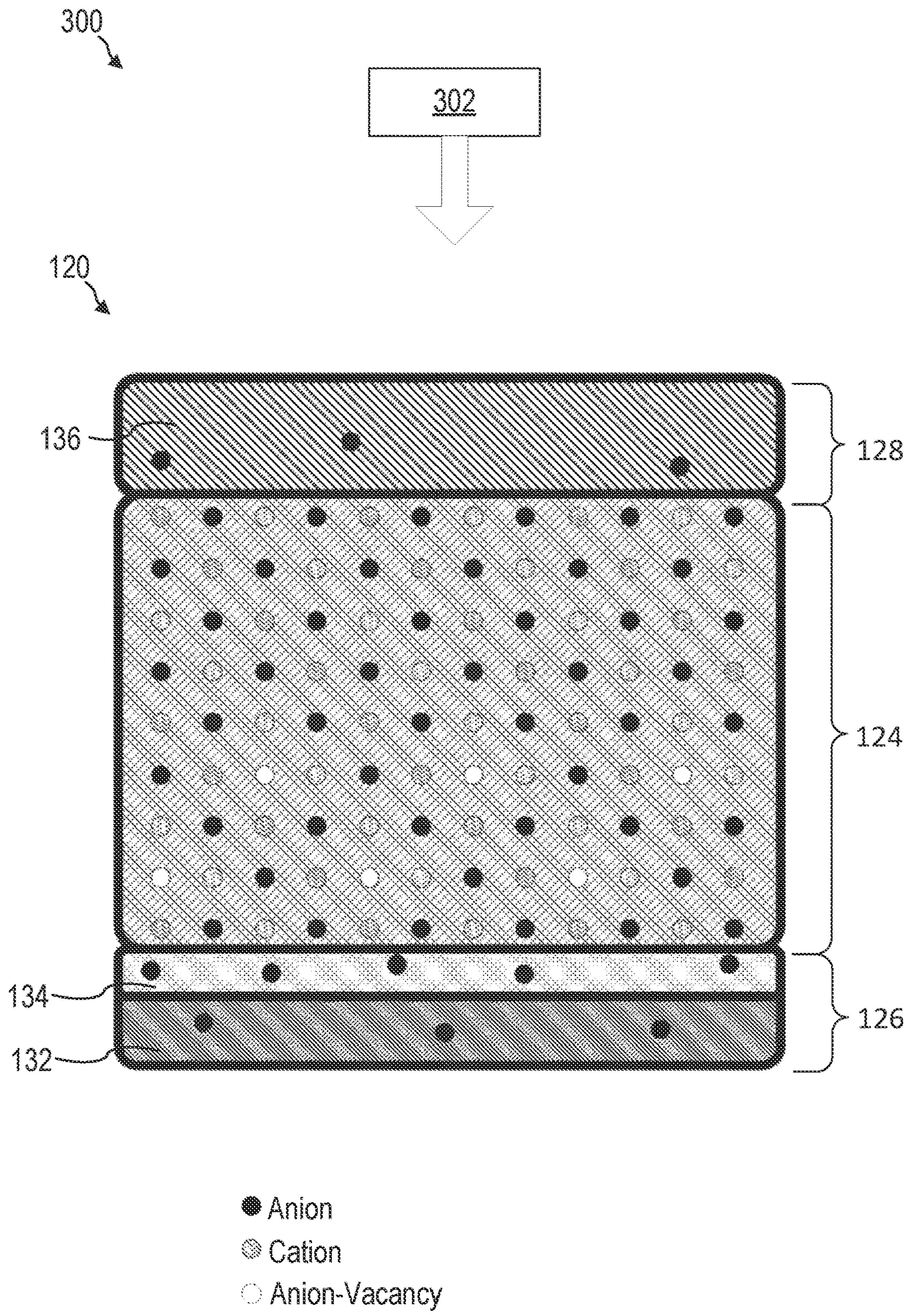

With reference to FIG. 3B, the application of a positive bias on the second electrode 128 may induce a transfer of anions from the functional material of the first functional layer 134 to the spontaneously polarizable material of the memory element 124. This may increase the anion content within the spontaneously polarizable material of the memory element 124. The spontaneously polarizable material may be configured to change its crystal structure back responsive to the application of the positive bias. This may reverse the changes of the material properties as induced by the negative bias. It is understood that this applies correspondingly vice versa such that a positive bias induces initial changes of the properties and that the negative bias reverses these changes.

Figure 4A:
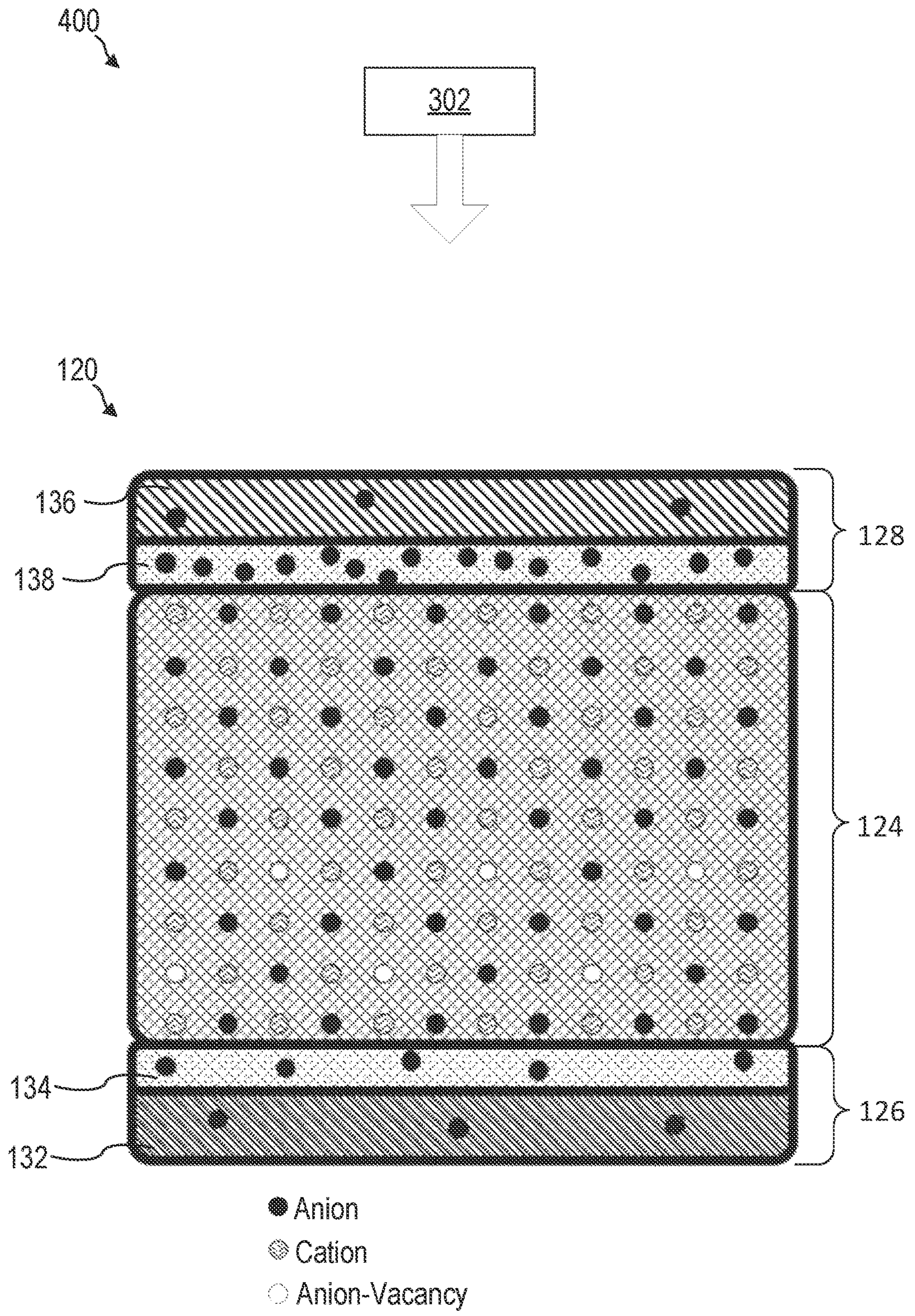
FIG. 4A and FIG. 4B show a spontaneously polarizable capacitor structure after the application of a first electric field and a second electric field, respectively.
Figure 4B:
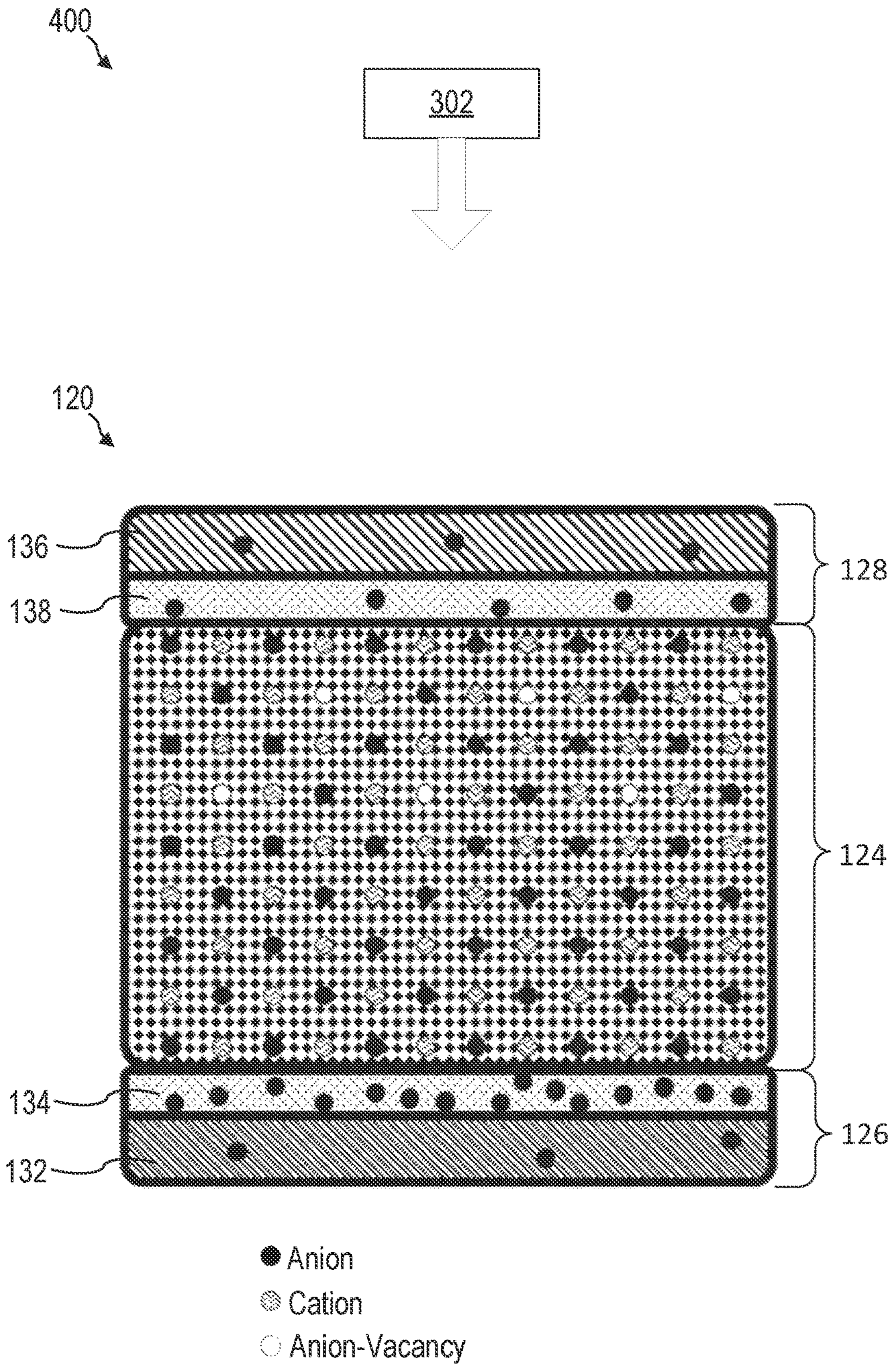

With reference to FIG. 4A and FIG. 4B, the SPOC structure 120 may include the first functional layer 134 and the second functional layer 138. In this case, the first electrode 126 and the second electrode 128 may be different from one another. For example, the first functional layer 134 may have a first anion concentration different from a second anion concentration of the second functional layer 138.

The application of a positive bias on the second electrode 128 may induce a transfer of anions from the spontaneously polarizable material into the functional material of the second functional layer 138 (see, for example, FIG. 4A), and the application of a negative bias on the second electrode 128 may induce a transfer of anions from the functional material of the first functional layer 134 to the spontaneously polarizable material and from the spontaneously polarizable material of the memory element 124 into the functional material of the first functional layer 134 (see, for example, FIG. 4B).

According to various aspects, the functional material of the respective functional layer may be configured to change its structure as a function of the anion content. For example, the functional material may be amorphous and the anions may be located randomly within the amorphous material. However, also a crystallization of the amorphous material can be triggered by the transfer of anions since the content of anions may reduce the energy required to onset the crystallization process (however, this may not be reversible). According to another example, the functional material may be a crystalline semi-conductive material. In this case, the anions may be located in interstitials (i.e., as interstitial atoms) of the crystalline material and/or may be integrated into the structure of the crystalline material such that the transfer of anions into the functional material may trigger a change of the crystal structure. The change of the crystal structure may also induce a change of a type of electric conductivity. For example, the functional material may change from being semi-conductive to being conductive. As an example, the functional material may include or may consist of crystalline tungsten-oxide and the transfer of anions may trigger a phase transition of the tungsten oxide from the beta phase (being semi-conductive) to the alpha phase (being conductive). The change of the crystal structure may also change a stress (e.g., compressive stress or tensile stress) the functional layer applies on the spontaneously polarizable material. This may induce changes of the structural, mechanical, and/or electronic properties of the spontaneously polarizable material. According to various aspects, a work function and/or a band structure of the spontaneously polarizable material and/or the functional material may be caused by the transfer of anions.

The functional material of the respective functional layer may include the same anion as the spontaneously polarizable material of the memory element 124.

Illustratively, each functional layer disposed in direct contact with the spontaneously polarizable material of the memory element 124 may serve as an anion storage for storing anions from the spontaneously polarizable material and also as an anion source for providing (e.g., anions of the amorphous material and/or anions received from the spontaneously polarizable material) to the spontaneously polarizable material of the memory element 124. Hence, the stoichiometry of the spontaneously polarizable material and a stoichiometry of the functional material may be changed by application of an electric field.

Hence, the properties of the spontaneously polarizable material of the memory element 124 can be modified during use of the memory device including one or more memory cells having the SPOC structure 120. Hence, the memory properties (e.g., the polarization properties) of the memory device may be modified by means of an application of an electric field (e.g., via applying a respective voltage to the first electrode 126 and the second electrode 128).

It is understood that changing the structure of the spontaneously polarizable material of the memory element 124 can change the memory properties of the material, thereby allowing a modification of the memory properties of the spontaneously polarizable material by means of an applied electric field.

In the following, a configuration in which the spontaneously polarizable material includes oxygen as anions and in which the functional material includes oxygen as anions is described for illustration. It is noted that the described principles apply correspondingly to different anions depending on the spontaneously polarizable material. The functional material may, on one hand, serve as an oxygen sink for the oxygen of the spontaneously polarizable material and the oxygen within the functional material (e.g., the oxygen of the functional material and/or the oxygen transferred to the functional material from the spontaneously polarizable material) may on the hand serve as an oxygen source.

The spontaneously polarizable material may be configured to change its crystal structure as a function of an amount of oxygen incorporated therein. As described herein, the transfer of oxygen from the spontaneously polarizable material to the functional material may cause the change of the crystal structure, and vice versa. The functional material may be a non-stoichiometric metal oxide (e.g., tungsten oxide) which structure may be changed as a function of the oxygen content.

As an example, by application of an electric field (e.g., positive or negative bias, as described above), oxygen may be transferred from the spontaneously polarizable material of the memory element 124 into the functional material of the associated functional layer. The increase oxygen content within the functional material may cause a structural change of the functional material (e.g., a change of the crystal structure in the case of a crystalline semi-conductive functional material) and the decreased oxygen content within the spontaneously polarizable material may cause a structural change (e.g., an increased content of oxygen interstitials or even a change of the crystal structure of one or more crystallites) of the spontaneously polarizable material. The structural change may be associated with an increase or decrease of the lattice parameter. The structural change of the spontaneously polarizable material may change the material properties of the spontaneously polarizable material. An increasing or decreasing lattice parameter may, for example, change the compressive stress or tensile stress on the spontaneously polarizable material, thereby changing the material properties of the spontaneously polarizable material. The structural change of the spontaneously polarizable material may be a change of the crystal structure. Hence, the arrangement of the atoms may be modified since another crystal structure may be thermodynamically stable for the changed oxygen content. The changed material properties of the spontaneously polarizable material may be, for example, determined by means of measurements to acquire P-E-hysteresis loops. By application of an opposite electric field, oxygen may be transferred from the functional material to the spontaneously polarizable material. This may reverse the structural changes of the spontaneously polarizable material and the functional material, thereby also reversing the changes to the properties of the spontaneously polarizable material. It is understood that the transfer may be carried out the other way around. Illustratively, the functional material may be configured to store and release oxygen by application of an electric field via the first electrode 126 and the second electrode 128.

It is noted that some oxygen atoms may be transferred into the first electrically conductive electrode layer 132 and/or the second electrically conductive electrode layer 136. However, this may be significantly less than the amount of oxygen transferred into the functional layer(s) and may not or minimally influence the change of the memory properties.

The spontaneously polarizable material of the memory element 124 may include or may consist of hafnium zirconium oxide ($Hf_{1-x}Zr_xO$, HZO) with $0 \le x \le 1$, PZT or SBT. In comparison to HZO, PZT and SBT have a very weak bond strength to oxygen. This may result in an increased oxygen transfer allowing an increased range for modifying the properties of the respective material. As an exemplary configuration, the functional material may consist of tungsten oxide and the spontaneously polarizable material may consist of HZO.

Various aspects relate to a SPOC structure 120 including a memory element 124 and one or more (amorphous and/or semi-conductive) functional layers in direct contact with the spontaneously polarizable material of the memory element 124. It is understood that at least one of the one or more functional layers may be crystalline and another one of the one or more functional layers may be amorphous. It is understood that at least one of the one or more functional layers may be conductive and another one of the one or more functional layers may be semi-conductive. In either case, the at least one functional layer may still be configured such that the transfer of oxygen to the functional layer or the oxygen transfer out of the functional layer causes the structural change to the functional layer. In the case of a crystalline functional layer, the structural change may be, for example, a change of the crystal structure. As an example, the functional layer may be a crystalline tungsten oxide layer and the transfer of oxygen to or from the layer may induce a phase change (also referred to as phase transformation or phase transition) from the α body centered cubic phase to the β phase, or vice versa.

Figure 6A:
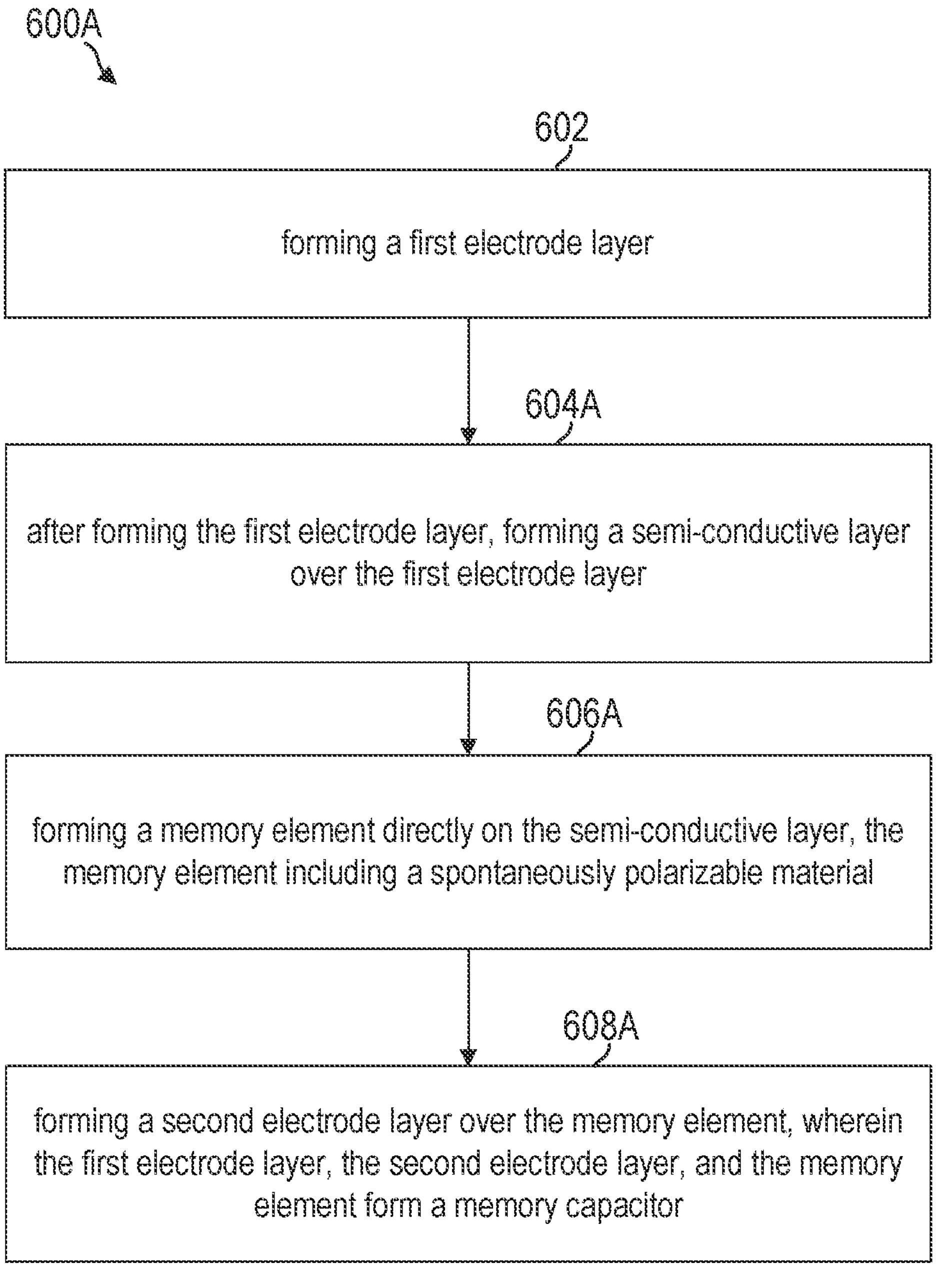
FIG. 6A to FIG. 6C each show a flow diagram of a method for processing a memory capacitor according to various aspects.
Figure 6B:
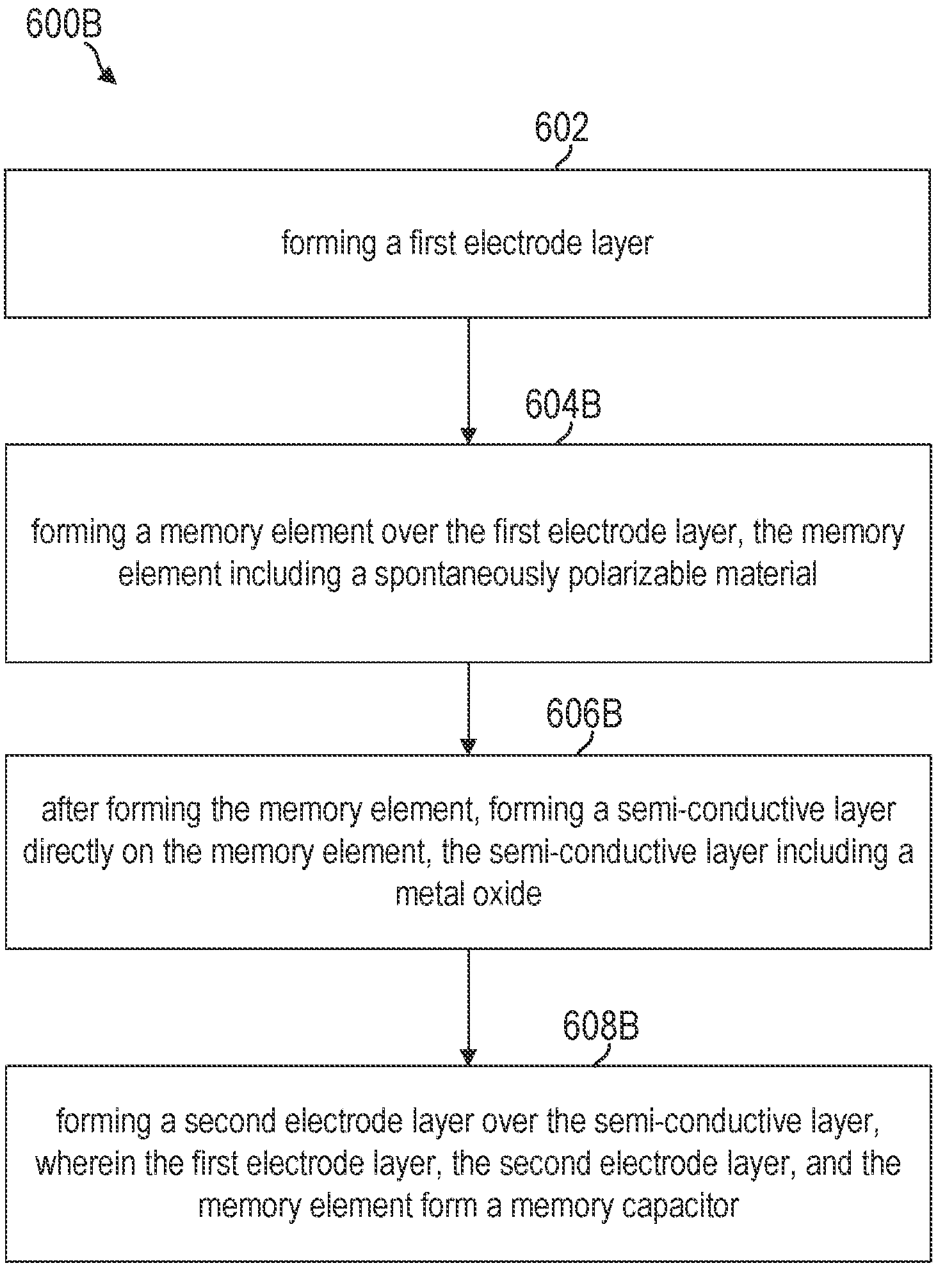
Figure 6C:
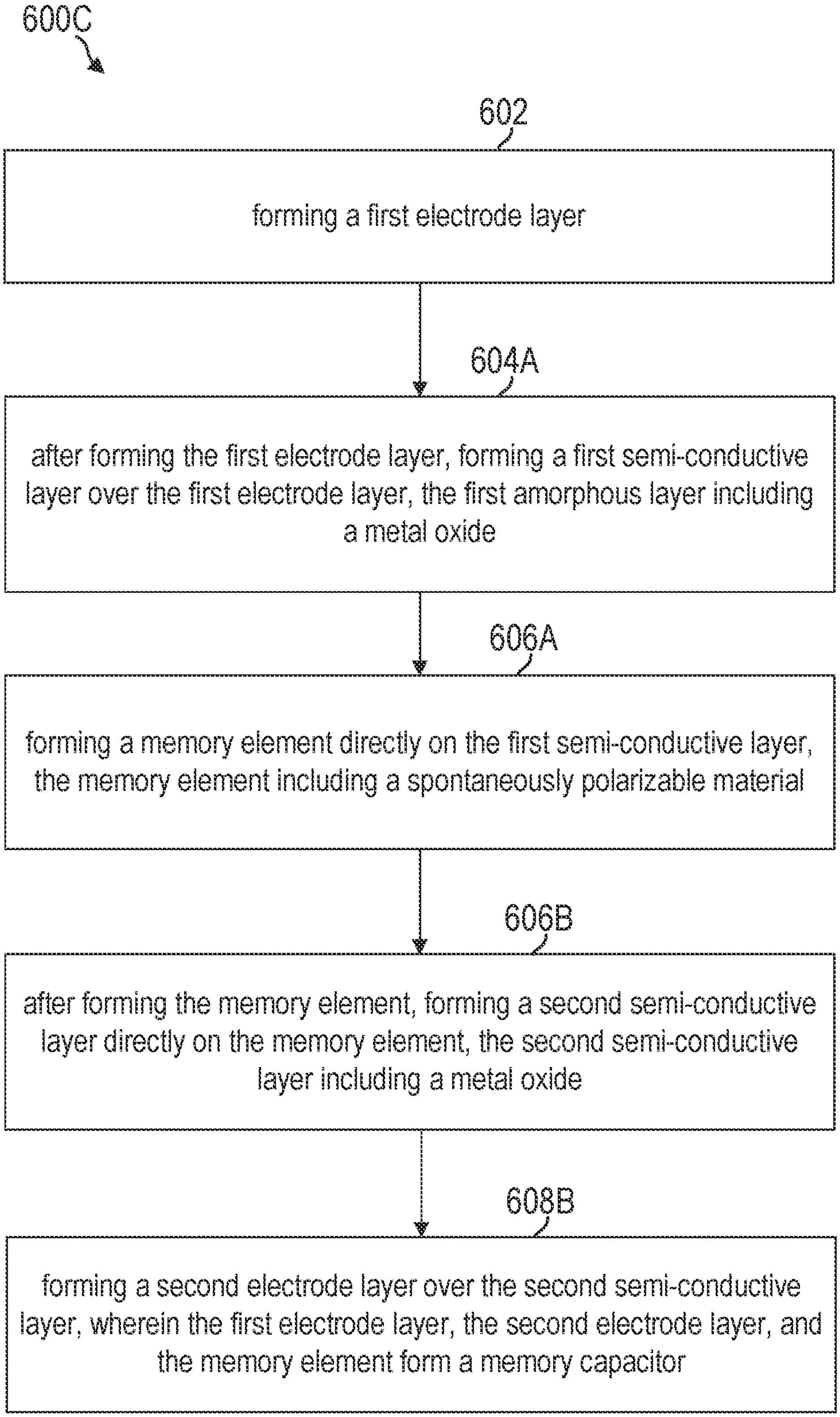

FIG. 6A, FIG. 6B, and FIG. 6C each show a flow diagram of a respective method 600A, 600B, 600C, for processing (e.g., manufacturing) a memory capacitor (e.g., a SPOC structure 120 having one of the configurations described herein).

The method 600A may be employed to process a memory capacitor having a capacitor structure as shown in FIG. 1B. The method 600B may be employed to process a memory capacitor having a capacitor structure as shown in FIG. 1C. The method 600C may be employed to process a memory capacitor having a capacitor structure as shown in FIG. 1D.

Each of the methods 600A, 600B, 600C may include forming a first electrode layer (in 602). The first electrode layer may be formed at least one of over or in a substrate. In some aspects, the substrate may include or may be a silicon substrate (e.g., with or without) a (e.g., native) $SiO_2$ surface layer, or any other suitable semiconductor substrate. In other aspects, the substrate may include or may be an electrically non-conductive substrate (e.g., a glass substrate). In still other aspects, the substrate may include or may be an electrically conductive substrate (e.g., a metal substrate). The first electrode layer may an electrically conductive electrode layer. The first electrode layer may form the first electrically conductive electrode layer 132 of the SPOC structure 120 described herein.

The method 600A and/or the method 600C may include forming a (e.g., amorphous and/or semi-conductive) functional layer (e.g., a first functional layer in the case of method 600C) over the first electrode layer (in 604A). The functional layer may be formed after forming the first electrode layer. The functional layer may include or may consist of a metal oxide, such as an electrically non-isolating (e.g., semi-conductive) metal oxide. For example, the functional layer may include or may consist of tungsten oxide, $WO_x$, as (e.g., semi-conductive and/or amorphous) metal oxide (e.g., semi-conductive $WO_3$). The first electrode layer may include or may consist of metal or metal oxide (e.g., in the case of tungsten oxide as functional layer, the first electrode layer may include or may consist of tungsten). The functional layer may be formed by depositing the metal oxide over the first electrode layer. Alternatively, the functional layer may be formed by partially oxidizing a surface layer portion of the first electrode layer. Even further alternatively, the functional layer may be formed by iteratively depositing a metal material and oxidizing the metal material to thereby form the functional layer after two or more iterations. The oxidation of the metal of the first electrode layer and/or the oxidation of the deposited metal material may be achieved by injecting a predefined concentration of an oxidizer (e.g., >200 g/m$^3$) into a processing chamber in which the memory capacitor is processed (e.g., prior to forming the memory element). A duration for which the first electrode layer is exposed to the oxidizer and/or for which the metal material is exposed to the oxidizer may be longer than 10 s. A process temperature during a time for which the first electrode layer is exposed to the oxidizer and/or for which the metal material is exposed to the oxidizer may be higher than a process temperature during the subsequent forming of the spontaneously polarizable material of the memory element. The oxidizer may include $O_3$, $H_2O$, and/or $O_2$. As an example, iteratively a thin metal film (e.g., having a thickness in the range from about 1 nm to about 5 nm) may be deposited and subsequently oxidized (e.g., by an $O_3$ treatment) until a desired film thickness is reached.

The method 600A and/or the method 600C may include forming a memory element directly on the functional layer (in 606A). The memory element may include a spontaneously polarizable material. Forming the memory element may include depositing a spontaneously polarizable layer that includes or consists of the spontaneously polarizable material. Forming the memory element may include depositing an amorphous memory material directly on the functional layer, wherein the amorphous memory material exhibits its spontaneously polarizable (e.g., remanently polarizable) properties after crystallization, thereby providing the spontaneously polarizable material.

The method 600A may include forming a second electrode layer over the memory element (in 608A).

The method 600B may include forming a memory element over the first electrode layer (in 604B). The memory element may include a spontaneously polarizable material. Forming the memory element may include depositing a spontaneously polarizable layer that includes or consists of the spontaneously polarizable material. Forming the memory element may include depositing an amorphous memory material directly on the amorphous layer, wherein the amorphous memory material exhibits spontaneously polarizable (e.g., remanently polarizable) properties after crystallization, thereby providing the spontaneously polarizable material.

The method 600B and/or the method 600C may include forming a (e.g., amorphous and/or semi-conductive) functional layer (e.g., a second functional layer in the case of method 600C) directly on the memory element (in 606B). The functional layer may be formed after forming the memory element. The functional layer may be formed prior to or after crystallizing the amorphously deposited spontaneously polarizable material. The functional layer may include or may consist of a metal oxide, such as an electrically non-isolating metal oxide. For example, the functional layer may include or may consist of tungsten oxide, $WO_x$, as metal oxide. The first electrode layer may include or may consist of metal or metal oxide (e.g., in the case of tungsten oxide as functional layer, the first electrode layer may include or may consist of tungsten). The functional layer may be formed by depositing the metal oxide over the memory element. Alternatively, the functional layer may be formed by iteratively depositing a metal material and oxidizing the metal material to thereby form the amorphous layer after two or more iterations. The oxidation of the deposited metal material may be achieved by injecting a predefined concentration of an oxidizer (e.g., >200 g/m$^3$) into a processing chamber in which the memory capacitor is processed (e.g., prior to forming the memory element). The oxidizer may include $O_3$, $H_2O$, and/or $O_2$. As an example, iteratively a thin metal film (e.g., having a thickness in the range from about 1 nm to about 5 nm) may be deposited and subsequently oxidized (e.g., by an $O_3$ treatment) until a desired film thickness is reached.

The method 600B and/or the method 600C may include forming a second electrode layer over the functional layer (e.g., the second functional layer in the case of method 600C) which is disposed over the memory element.

The first electrode layer, the second electrode layer, and the memory element may form a memory capacitor.

A method for manufacturing a memory cell arrangement may include one of the methods 600A, 600B, 600C for processing the memory capacitor. The method for manufacturing the memory cell arrangement may further include structuring the memory capacitor into a plurality of memory cells. Each memory cell of the plurality of memory cells may include the SPOC structure 120 generated by the respective method 600A, 600B, or 600C.

Optionally, in each of the methods 600A, 600B, 600C the spontaneously polarizable material of the memory element may be formed (e.g., deposited, e.g., via atomic layer deposition) amorphous and crystallized afterwards. This crystallization process (e.g., via thermal annealing) of the spontaneously polarizable material may be carried out in between any of the intermediate processes of forming the memory capacitor. The crystallization process may, for example, be carried either prior to or after structuring the spontaneously polarizable material into the plurality of memory cells. However, it is understood that each functional layer described herein may be amorphous prior to and/or after manufacturing the memory capacitor (and manufacturing the memory cell arrangement). For example, in the case of an amorphous functional material, the memory capacitor (e.g., the SPOC structure 120) may be configured such that the thermal annealing induces the crystallization of the spontaneously polarizable material but substantially no crystallization of the amorphous functional material of the respective functional layer.

Figure 7:
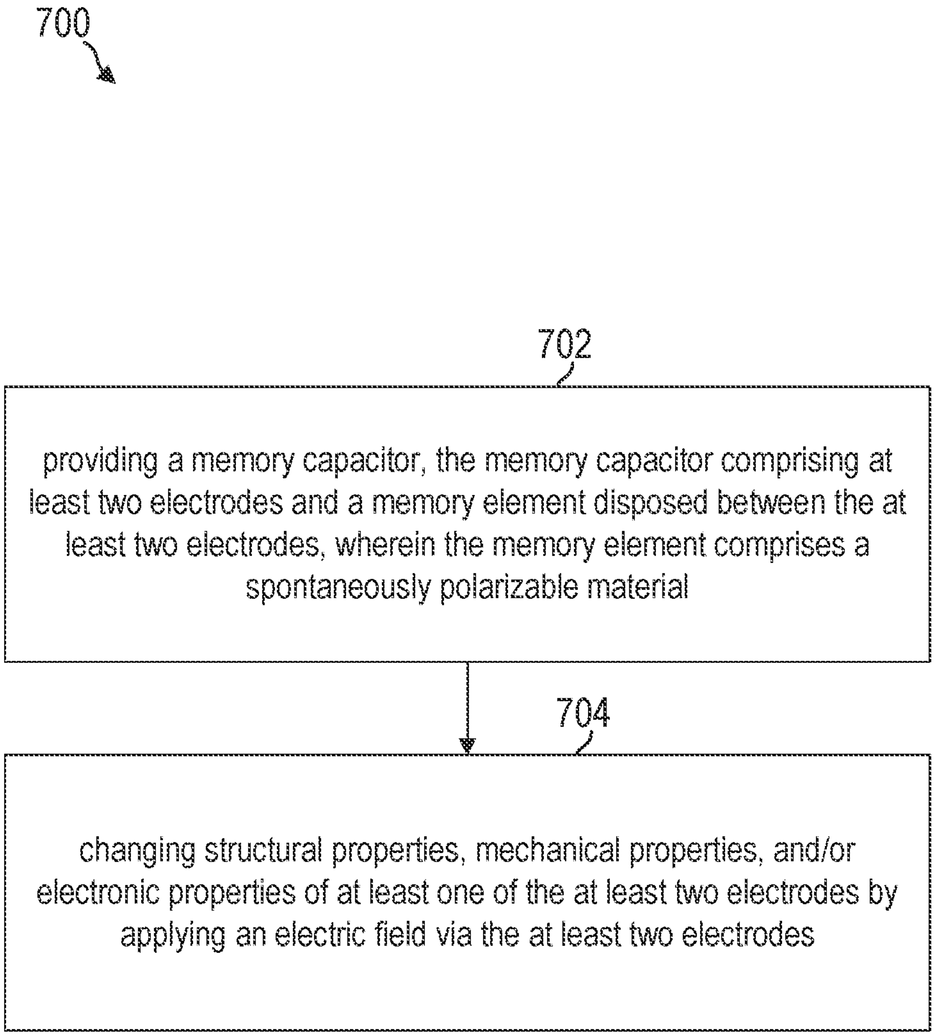
FIG. 7 shows a flow diagram of a method for changing properties of at least one electrode of a spontaneously polarizable capacitor structure according to various aspects.

FIG. 7 shows a flow diagram of a method 700 for changing properties of at least one electrode of a spontaneously polarizable capacitor structure according to various aspects. The method 700 may include providing a memory capacitor, the memory capacitor including at least two electrodes and a memory element disposed between the at least two electrodes (in 702). The memory element may include a spontaneously polarizable material. The method 700 may include changing structural properties, mechanical properties, and/or electronic properties of at least one of the at least two electrodes by applying an electric field (e.g., by means of a voltage drop) via the at least two electrodes (in 704). Optionally, the method 700 may further include changing an oxygen content and/or an oxygen distribution in the spontaneously polarizable material of the memory element by applying the electric field via the at least two electrodes.

In the following, various examples are provided that may include one or more aspects described above with reference to a memory cell including the SPOC structure 120, a memory capacitor layer stack including the SPOC structure 120, a memory device including the SPOC structure 120, with reference to methods 600A, 600B, 600C, and 700. It may be intended that aspects described in relation to one of the methods 600A, 600B, 600C, 700 may apply also to the other methods. It may be intended that aspects described in relation to the methods 600A, 600B, 600C, 700 may apply also to the memory cell, the memory device, and the memory capacitor layer stack, and vice versa. For example, the methods 600A, 600B, 600C may include at least a part of the formation of the SPOC structure 120 and the method 700 may include at least part of controlling the SPOC structure 120.

Example 1 is a memory cell including: a first electrode; a second electrode; and a memory element disposed between the first electrode and the second electrode, the memory element including a spontaneously polarizable material, the first electrode, the second electrode, and the memory element forming a memory capacitor, wherein the first electrode and/or the second electrode includes: an electrically conductive electrode layer, and a functional layer including an amorphous material, wherein the functional layer is in direct physical contact with the memory element.

In Example 2, the subject matter of Example 1 can optionally include that an average grain width of the spontaneously polarizable material is greater than 20 nm.

In Example 3, the subject matter of Examples 1 or 2 can optionally include that a coefficient of thermal expansion of the electrically conductive electrode layer is below 7 ppm.

In Example 4, the subject matter of any one of Examples 1 to 3 can optionally include that a work function of the functional layer is greater than a work function of the electrically conductive electrode layer.

In Example 5, the subject matter of any one of Examples 1 to 4 can optionally include that the amorphous material is a metal oxide.

In Example 6, the subject matter of any one of Examples 1 to 5 can optionally include that the amorphous material includes tungsten.

In Example 7, the subject matter of any one of Examples 1 to 6 can optionally include that the amorphous material includes a non-stoichiometric metal oxide.

In Example 8, the subject matter of any one of Examples 1 to 7 can optionally include that the amorphous material is configured to store and release oxygen by application of an electric field via the first electrode and the second electrode.

In Example 9, the subject matter of any one of Examples 1 to 8 can optionally include that the spontaneously polarizable material of the memory element is a remanent-polarizable material.

In Example 10, the subject matter of any one of Examples 1 to 9 can optionally include that the amorphous material is electrically conductive or electrically semi-conductive.

In Example 11, the subject matter of any one of Examples 1 to 10 can optionally include that the first electrode includes a first functional layer and wherein the second electrode includes a second functional layer; and wherein the first functional layer includes a first oxygen concentration different from a second oxygen concentration of the second functional layer.

In Example 12, the subject matter of any one of Examples 1 to 11 can optionally include that the amorphous material is configured to change its structure as a function of an amount of oxygen incorporated therein (e.g., by increasing the concentration of interstitial oxygen atoms).

In Example 13, the subject matter of any one of Examples 1 to 12 can optionally include that the spontaneously polarizable material is configured to change its crystal structure as a function of an amount of oxygen incorporated therein.

In Example 14, the subject matter of any one of Examples 1 to 13 can optionally include that the spontaneously polarizable material is configured to change its crystal structure based on a transfer of oxygen from and/or to the functional layer.

In Example 15, the subject matter of any one of Examples 1 to 14 can optionally include that the memory element includes a first spontaneously polarizable layer and a second spontaneously polarizable layer, the first and second spontaneously polarizable layers including the spontaneously polarizable material of the memory element, and an additional functional layer disposed between the first spontaneously polarizable layer and the second spontaneously polarizable layer.

In Example 16, the subject matter of Example 15 can optionally include that the additional functional layer includes an amorphous material, and, wherein at least one of: the amorphous material is a metal oxide, the amorphous material is an amorphous tungsten containing material, the amorphous material is amorphous tungsten oxide, the amorphous material is a non-stoichiometric metal oxide, the amorphous material is configured to store and release oxygen by application of an electric field via the first electrode and the second electrode, and/or the amorphous material is electrically conductive or electrically semi-conductive.

Example 17 is a method for processing a memory capacitor, the method including: forming a first electrode layer; after forming the first electrode layer, forming an amorphous layer over the first electrode layer, the amorphous layer including an electrically non-isolating metal oxide; forming a memory element directly on the amorphous layer, the memory element including a spontaneously polarizable material; and forming a second electrode layer over the memory element, wherein the first electrode layer, the second electrode layer, and the memory element form a memory capacitor.

Example 18 is a method for processing a memory capacitor, the method including: forming a first electrode layer; forming a memory element over the first electrode layer, the memory element including a spontaneously polarizable material; and after forming the memory element, forming an amorphous layer directly on the memory element, the amorphous layer including an electrically non-isolating metal oxide; forming a second electrode layer over the amorphous layer, wherein the first electrode layer, the second electrode layer, and the memory element form a memory capacitor.

In Example 19, the subject matter of Examples 17 or 18 can optionally include that forming the amorphous layer includes partially oxidizing a surface layer portion of the first electrode layer to thereby form the amorphous layer.

In Example 20, the subject matter of Example 17 and optionally of Example 19 can optionally include that the first electrode layer includes a metal and that the amorphous layer is a metal oxide formed from the metal.

In Example 21, the subject matter of Example 20 can optionally include that an oxidation of the metal of the first electrode layer is achieved by injecting a predefined concentration of an oxidizer (e.g., >200 g/m3) into a processing chamber in which the memory capacitor is processed prior to forming the memory element.

In Example 22, the subject matter of Example 21 can optionally include that a duration for which the first electrode layer is exposed to the oxidizer is longer than 10 s.

In Example 23, the subject matter of Examples 21 or 22 can optionally include that a process temperature during a time for which the first electrode layer is exposed to the oxidizer is higher than a process temperature during forming the spontaneously polarizable material of the memory element.

In Example 24, the subject matter of any one of Examples 17 to 19 can optionally include that forming the amorphous layer includes depositing a metal material and oxidizing the metal material to thereby form the amorphous layer.

In Example 25, the subject matter of Example 24 can optionally include that forming the amorphous layer includes iteratively depositing a metal material and oxidizing the metal material to thereby form the amorphous layer after two or more iterations.

In Example 26, the subject matter of Example 25 can optionally include that an oxidation of the metal material is achieved by injecting a predefined concentration of an oxidizer (e.g., >200 g/m3) into a processing chamber in which the memory capacitor is processed.

In Example 27, the subject matter of any one of Examples 21 to 23 or of Example 20 can optionally include that the oxidizer includes $O_3$, and/or wherein the oxidizer includes $H_2O$, and/or wherein the oxidizer includes $O_2$ plasma.

In Example 28, the subject matter of any one of Examples 17 to 27 can optionally include that the amorphous layer is formed by intermediate oxidation steps in between a deposition procedure for depositing the spontaneously polarizable material of the memory element.

In Example 29, the method of any one of Examples 17 to 28 can optionally include that forming the memory element includes depositing spontaneously polarizable layer that includes the spontaneously polarizable material.

Example 30 is a method for processing a memory capacitor, the method including: forming a first electrode layer; after forming the first electrode layer, forming a first amorphous layer over the first electrode layer, the first amorphous layer including an electrically non-isolating metal oxide; forming a memory element directly on the first amorphous layer, the memory element including a spontaneously polarizable material; after forming the memory element, forming a second amorphous layer directly on the memory element, the second amorphous layer including an electrically non-isolating metal oxide; forming a second electrode layer over the second amorphous layer, wherein the first electrode layer, the second electrode layer, and the memory element form a memory capacitor.

Example 31 is a memory capacitor layer stack including: a first electrode layer; a second electrode layer; and a memory element disposed between the first electrode layer and the second electrode layer, the memory element including: a first spontaneously polarizable layer, a second spontaneously polarizable layer, and a functional layer including an amorphous material, wherein the functional layer is in direct physical contact with both the first spontaneously polarizable layer and the spontaneously polarizable layer and wherein the functional layer is disposed between the first spontaneously polarizable layer and the second spontaneously polarizable layer.

In Example 32, the subject matter of Example 31 can optionally include that an average grain width of a spontaneously polarizable material of the first spontaneously polarizable layer and/or the second spontaneously polarizable layer is greater than 20 nm.

In Example 33, the subject matter of Examples 31 or 32 can optionally include that a coefficient of thermal expansion of the first electrode layer and/or the second electrode layer is below 7 ppm.

In Example 34, the subject matter of any one of Examples 31 to 33 can optionally include that a work function of the functional layer is greater than a work function of the first electrode layer and/or the second electrode layer.

In Example 35, the subject matter of any one of Examples 31 to 34 can optionally include that the amorphous material is a metal oxide.

In Example 36, the subject matter of any one of Examples 31 to 35 can optionally include that the amorphous material includes tungsten.

In Example 37, the subject matter of any one of Examples 31 to 36 can optionally include that the amorphous material includes a non-stoichiometric metal oxide.

In Example 38, the subject matter of any one of Examples 31 to 37 can optionally include that the amorphous material is configured to store and release oxygen by application of an electric field via the first electrode and the second electrode.

In Example 39, the subject matter of any one of Examples 31 to 38 can optionally include that a spontaneously polarizable material of the first spontaneously polarizable layer and/or the second spontaneously polarizable layer is a remanent-polarizable material.

In Example 40, the subject matter of any one of Examples 31 to 39 can optionally include that the amorphous material is electrically conductive or electrically semi-conductive.

In Example 41, the subject matter of any one of Examples 31 to 40 can optionally include that at least one additional functional layer is disposed between the first electrode layer and the memory element and/or between the second electrode layer and the memory element.

In Example 42, the subject matter of any one of Examples 31 to 41 can optionally include that the amorphous material is configured to change its structure as a function of an amount of oxygen incorporated therein.

In Example 43, the subject matter of any one of Examples 31 to 42 can optionally include that a spontaneously polarizable material of the first spontaneously polarizable layer and/or the second spontaneously polarizable layer is configured to change its crystal structure as a function of an amount of oxygen incorporated therein.

In Example 44, the subject matter of any one of Examples 31 to 43 can optionally include that a spontaneously polarizable material of the first spontaneously polarizable layer and/or the second spontaneously polarizable layer is configured to change its crystal structure based on a transfer of oxygen from and/or to the functional layer.

In Example 45, the subject matter of any one of Examples 31 to 44 can optionally include that the at least one additional functional layer includes an amorphous material, and, wherein at least one of: the amorphous material is a metal oxide, the amorphous material is an amorphous tungsten containing material, the amorphous material is amorphous tungsten oxide, the amorphous material is a non-stoichiometric metal oxide, the amorphous material is configured to store and release oxygen by application of an electric field via the first electrode and the second electrode, and/or the amorphous material is electrically conductive or electrically semi-conductive.

Example 46 is a memory device, including the memory cell according to any one of Examples 1 to 30 or a memory cell including the memory capacitor layer stack according to any one of Examples 31 to 45. The memory device may further include: a control circuit configured to: apply a first electric field via the first electrode and the second electrode to write the memory cell into one of at least two memory states and/or to apply a second electric field via the first electrode and the second electrode to read the memory state of the memory cell, and apply a third electric field via the first electrode and the second electrode to change the polarization properties of the spontaneously polarizable material of the memory element, wherein the electric field strength of the third electric field is greater than the electric field strength of the first electric field and the electric field strength of the second electric field.

In Example 47, the subject matter of Example 46 can optionally include that the polarization properties include at least one of: a maximum remanent polarization, a coercive field, a position of the polarization vs electric field hysteresis loop, and/or a slope of the polarization vs electric field hysteresis loop.

In Example 48, the subject matter of Example 46 or 47 can optionally include that the memory cell is configured such that the application of the third electric field increases the oxygen content within the amorphous material by transfer of oxygen from the memory element to the amorphous layer, or wherein the memory cell is configured such that the application of the third electric field decreases the oxygen content within the amorphous material by transfer of oxygen from the amorphous layer to the memory element.

In Example 49, the subject matter of any one of Examples 46 to 48 can optionally include that the amorphous layer is configured such that the application of the third electric field induces a crystallization of the amorphous layer.

In Example 50, the subject matter of any one of Examples 46 to 49 can optionally include that the spontaneously polarizable material is configured to change its crystal structure responsive to the application of the third electric field.

In Example 51, the subject matter of any one of Examples 46 to 49 can optionally include that the control circuit is configured to apply a fourth electric field different from the third electric field; wherein the spontaneously polarizable material is configured to change its crystal structure responsive to the application of the third electric field from a first crystal structure to a second crystal structure different from the first crystal structure and to change its crystal structure from the second crystal structure to the first crystal structure responsive to the application of the fourth electric field.

In Example 52, the subject matter of any one of Examples 46 to 51 can optionally include that the control circuit is configured to apply a fourth electric field different from the third electric field; wherein the memory cell is configured such that the application of the third electric field changes the oxygen content within the amorphous material by transferring oxygen between the memory element and the amorphous layer to thereby change the structure of the amorphous material; and wherein the memory cell is configured such that the application of the fourth electric field reverses the structural change of the amorphous material.

Example 53 is a memory cell including: a first electrode; a second electrode; and a memory element disposed between the first electrode and the second electrode, the memory element including a spontaneously polarizable material, the first electrode, the second electrode, and the memory element forming a memory capacitor, wherein the first electrode and/or the second electrode includes: an electrically conductive electrode layer, and a functional layer including a (e.g., electrically) semi-conductive material, wherein the functional layer is in direct physical contact with the memory element.

In Example 54, the subject matter of Example 53 can optionally include that an average grain width of the spontaneously polarizable material is greater than 20 nm.

In Example 55, the subject matter of Examples 53 or 54 can optionally include that the semi-conductive material is a semi-conductive metal oxide.

In Example 56, the subject matter of Example 55 can optionally include that the semi-conductive metal oxide is semi-conductive tungsten oxide.

In Example 57, the subject matter of any one of Examples 53 to 56 can optionally include that the semi-conductive material is configured to store and release oxygen by application of an electric field via the first electrode and the second electrode.

In Example 58, the subject matter of any one of Examples 53 to 57 can optionally include that the spontaneously polarizable material of the memory element is a remanent polarizable material.

In Example 59, the subject matter of any one of Examples 53 to 58 can optionally include that the first electrode includes a first functional layer and wherein the second electrode includes a second functional layer; and wherein the first functional layer includes a first oxygen concentration different from a second oxygen concentration of the second functional layer.

In Example 60, the subject matter of any one of Examples 53 to 59 can optionally include that the semi-conductive material is configured to change its material properties as a function of an amount of oxygen incorporated therein.

In Example 61, the subject matter of any one of Examples 53 to 60 can optionally include that the semi-conductive material is configured to change its material properties by application of an electric field via the first electrode and the second electrode.

In Example 62, the subject matter of any one of Examples 53 to 61 can optionally include that the semi-conductive material is configured to change its material properties as a function of an amount of oxygen incorporated in the spontaneously polarizable material.

In Example 63, the subject matter of any one of Examples 60 to 62 can optionally include that the material properties include structural properties, mechanical properties, and/or electronic properties.

In Example 64, the subject matter of Example 63 can optionally include that the structural properties include a crystal structure of the semi-conductive material.

In Example 65, the subject matter of Examples 63 or 64 can optionally include that the mechanical properties include a mechanical stress (e.g., compressive stress or tensile stress) within the semi-conductive material.

In Example 66, the subject matter of any one of Examples 63 to 65 can optionally include that the electronic properties include a type of electric conductivity (e.g., from being semi-conductive to being conductive), an electric conductivity, a work function, and/or a band structure of the semi-conductive material.

In Example 67, the subject matter of any one of Examples 53 to 66 can optionally include that the semi-conductive material is amorphous.

In Example 68, the subject matter of any one of Examples 53 to 67 can optionally include that the spontaneously polarizable material is configured to change its material properties as a function of an amount of oxygen incorporated therein.

In Example 69, the subject matter of any one of Examples 53 to 68 can optionally include that the spontaneously polarizable material is configured to change its material properties by application of an electric field via the first electrode and the second electrode.

In Example 70, the subject matter of any one of Examples 53 to 69 can optionally include that the spontaneously polarizable material is configured to change its material properties as a function of an amount of oxygen incorporated in the semi-conductive material.

In Example 71, the subject matter of any one of Examples 53 to 70 can optionally include that the spontaneously polarizable material is configured to change its material properties based on a transfer of oxygen from and/or to the functional layer.

In Example 72, the subject matter of any one of Examples 68 to 71 can optionally include that the material properties include structural properties, mechanical properties, and/or electronic properties.

In Example 73, the subject matter of Example 72 can optionally include that the structural properties include a crystal structure of the spontaneously polarizable material.

In Example 74, the subject matter of Examples 72 or 73 can optionally include that the mechanical properties include a mechanical stress (e.g., compressive stress or tensile stress) within the spontaneously polarizable material.

In Example 75, the subject matter of any one of Examples 72 to 74 can optionally include that the electronic properties include a band structure of the spontaneously polarizable material; and/or wherein the electronic properties include a polarization/voltage drop characteristic or polarization/electric field characteristic of the spontaneously polarizable material; and/or wherein the change of the electronic properties includes a change of the spontaneously polarizable material from being antiferroelectric to being ferroelectric (or vice versa).

Example 76 is a memory cell including: a first electrode; a second electrode; and a memory element disposed between the first electrode and the second electrode, the memory element including a spontaneously polarizable material, the first electrode, the second electrode, and the memory element forming a memory capacitor, wherein the first electrode and/or the second electrode includes: an electrically conductive electrode layer, and a functional layer in direct physical contact with the memory element, wherein the functional layer is configured to store and release oxygen by application of an electric field via the first electrode and the second electrode.

Example 77 is a memory cell including: a first electrode; a second electrode; and a memory element disposed between the first electrode and the second electrode, the memory element including a spontaneously polarizable material, the first electrode, the second electrode, and the memory element forming a memory capacitor, wherein at least a portion of the first electrode is configured to change its properties as a function of a transfer of oxygen from the spontaneously polarizable material to the first electrode (or vice versa) and/or wherein at least a portion of the second electrode is configured to change its properties as a function of a transfer of oxygen from the spontaneously polarizable material to the second electrode (or vice versa).

Example 78 is a memory cell including: a first electrode; a second electrode; and a memory element disposed between the first electrode and the second electrode, the memory element including a metal-oxide-based ferroelectric material, the first electrode, the second electrode, and the memory element forming a memory capacitor, wherein the first electrode and/or the second electrode includes: an electrically conductive electrode layer, and a functional layer (e.g., including a metal oxide, such as tungsten oxide) configured to store and release oxygen by application of an electric field via the first electrode and the second electrode.

Example 79 is a memory device including: a memory cell including: a first electrode; a second electrode; and a memory element disposed between the first electrode and the second electrode, the memory element including a spontaneously polarizable material, the first electrode, the second electrode, and the memory element forming a memory capacitor, wherein the first electrode and/or the second electrode includes: an electrically conductive electrode layer, and a functional layer in direct physical contact with the memory element; and a control circuit configured to: apply a first electric field via the first electrode and the second electrode to write the memory cell into one of at least two memory states and/or to apply a second electric field via the first electrode and the second electrode to read the memory state of the memory cell, and apply a third electric field (could be understood as voltage drop, of course) via the first electrode and the second electrode to change the properties of the spontaneously polarizable material of the memory element.

In Example 80, the subject matter of Example 79 can optionally include that the memory cell is configured such that the application of the third electric field increases the oxygen content within the functional layer by transfer of oxygen from the memory element to the functional layer, or wherein the memory cell is configured such that the application of the third electric field decreases the oxygen content within the functional layer by transfer of oxygen from the functional layer to the memory element.

In Example 81, the subject matter of Example 79 or 80 can optionally include that the control circuit is configured to apply a fourth electric field different from the third electric field; wherein the spontaneously polarizable material is configured to change its structural properties, mechanical properties, and/or electronic properties responsive to the application of the third electric field, wherein the spontaneously polarizable material is configured such that the application of the fourth electric field reverses the changes induced by the third electric field.

In Example 82, the subject matter of any one of Examples 79 to 81 can optionally include that the control circuit is configured to apply a fourth electric field different from the third electric field; wherein the functional layer is configured to change its structural properties, mechanical properties, and/or electronic properties responsive to the application of the third electric field, wherein the functional layer is configured such that the application of the fourth electric field reverses the changes induced by the third electric field.

Example 83 is a method including: providing a memory capacitor, the memory capacitor including at least two electrodes and a memory element disposed between the at least two electrodes, wherein the memory element includes a spontaneously polarizable material; and changing structural properties, mechanical properties, and/or electronic properties of at least one of the at least two electrodes by applying an electric field (e.g., by means of a voltage drop) via the at least two electrodes.

In Example 84, the method of Example 83 can optionally further include: changing an oxygen content and/or an oxygen distribution in the spontaneously polarizable material of the memory element by applying the electric field via the at least two electrodes.

In Example 85, the subject matter of Examples 83 or 84 can optionally include that the structural properties include a crystal structure of the at least one electrode.

In Example 86, the subject matter of any one of Examples 83 to 85 can optionally include that the mechanical properties include a mechanical stress within the at least one electrode.

In Example 87, the subject matter of any one of Examples 83 to 86 can optionally include that the electronic properties include a type of electric conductivity, an electric conductivity, a work function, and/or a band structure of the at least one electrode.

Several aspects are described with reference to a structure (e.g., a memory transistor structure, e.g., a field-effect transistor structure, e.g., a ferroelectric field-effect transistor structure, e.g., a capacitive memory structure) and it is noted that such a structure may include solely the respective element (e.g., a memory transistor, e.g., a field-effect transistor, e.g., a ferroelectric field-effect transistor, e.g., a capacitive memory); or, in other aspects, a structure may include the respective element and one or more additional elements.

In some aspects, two voltages may be compared with one another by relative terms such as “greater”, “higher”, “lower”, “less”, or “equal”, for example. It is understood that, in some aspects, a comparison may include the sign (positive or negative) of the voltage value or, in other aspects, the absolute voltage values (also referred to as the magnitude, or as the amplitude, e.g., of a voltage pulse) are considered for the comparison.

The term “switch” may be used herein to describe a modification of the memory state a memory cell is residing in. For example, in the case that a memory cell is residing in a first memory state (e.g., the LVT state), the memory state the memory cell is residing in may be switched such that, after the switch, the memory cell may reside in a second memory state (e.g., the HVT state), different from the first memory state. The term “switch” may thus be used herein to describe a modification of the memory state a memory cell is residing in, from a first memory state to a second memory state. The term “switch” may also be used herein to describe a modification of a polarization, for example of a spontaneously-polarizable memory element (e.g., of a spontaneously-polarizable layer, such as a remanent-polarizable layer). For example, a polarization of a spontaneously-polarizable memory element may be switched, such that the sign of the polarization varies from positive to negative or from negative to positive, while the absolute value of the polarization may remain in some aspects substantially unaltered. According to various aspects, writing a memory cell may include bringing the memory cell from one of at least two memory states into another one of the at least two memory states of the memory cell (e.g., from the LVT state into the HVT state, or vice versa).

The term “connected” may be used herein with respect to nodes, terminals, integrated circuit elements, and the like, to mean electrically connected, which may include a direct connection or an indirect connection, wherein an indirect connection may only include additional structures in the current path that do not influence the substantial functioning of the described circuit or device. The term “electrically conductively connected” that is used herein to describe an electrical connection between one or more terminals, nodes, regions, contacts, etc., may be understood as an electrically conductive connection with, for example, ohmic behavior, e.g., provided by a metal or degenerate semiconductor in absence of p-n junctions in the current path. The term “electrically conductively connected” may be also referred to as “galvanically connected”.

The term “coupled to” used herein with reference to functional parts of a memory cell (e.g., functional parts of a memory structure) that are coupled to respective nodes (e.g., source-line node, bit-line node, and/or word-line node) of the memory cell may be understood as follows: the respective functional parts are electrically conductively connected to corresponding nodes and/or the respective functional parts itself provide the corresponding nodes. As an example, a source/drain node of a field-effect transistor memory structure may be electrically conductively connected to the source-line node of the memory cell or the source/drain node of the field-effect transistor memory structure may provide the source-line node of the memory cell. As another example, a source/drain node of the field-effect transistor memory structure may be electrically conductively connected to the bit-line node of the memory cell or the source/drain node of the field-effect transistor memory structure may provide the bit-line node of the memory cell.

The term "metal" or "metal material" may be used herein to describe a metal (e.g., a pure or substantially pure metal), a mixture of more than one metal, a metal alloy, an intermetallic material, a conductive metal compound (e.g., a nitride), and the like. Illustratively, the term "metal" may be used herein to describe a material having an electrical conductivity typical of a metal, for example an electrical conductivity greater than $10^6$ S/m at a temperature of 20° C. The term "metal material" may be used herein to describe a material having the Fermi level inside at least one band.

The terms "electrically conducting" or "electrically conductive" may be used herein interchangeably to describe a material or a layer having an electrical conductivity or an average electrical conductivity greater than $10^6$ S/m at a temperature of 20° C. The term "electrically insulating" may be used herein interchangeably to describe a material or a layer having an electrical conductivity or an average electrical conductivity less than 10-10 S/m at a temperature of 20° C. In some aspects, a difference in electrical conductivity between an electrically conducting material (or layer) and an electrically insulating material (or layer) may have an absolute value of at least $10^{10}$ S/m at a temperature of 20° C., or of at least $10^{15}$ S/m at a temperature of 20° C.

The term "content" may be used herein, in some aspects, in relation to the "content of an element" in a material or in a layer to describe the mass percentage (or fraction) of that element over a total mass of the material (or of the layer). The term "content" may be used herein in relation to the "content of defects" in the structure of a material to describe the mass percentage of the defects over a total mass of the constituents of the structure. The term "content" may be used herein, in some aspects, in relation to the "content of an element" in a material or in a layer to describe the volume percentage of that element over a total volume of the material (or of the layer). The term "content" may be used herein in relation to the "content of defects" in the structure of a material to describe the volume percentage of the defects over a total volume of the structure.

The expression "a material of an element" or "a material of a layer", for example "a material of a memory element", or "a material of an electrode layer" may be used herein to describe a main component of that element or layer, e.g., a main material (for example, a main element or a main compound) present in that element or layer. The expression "a material of an element" or "a material of a layer" may describe, in some aspects, the material of that element or layer having a weight percentage greater than 60% over the total weight of the materials that the element or layer includes. The expression "a material of an element" or "a material of a layer" may describe, in some aspects, the material of that element or layer having a volume percentage greater than 60% over the total volume of the materials that the element or layer includes. As an example, a material of an element or layer including aluminum may describe that that element or layer is formed mostly by aluminum, and that other elements (e.g., impurities) may be present in a smaller proportion, e.g., having less weight percentage or less volume percentage compared to aluminum. As another example, a material of an element or layer including titanium nitride may describe that that element or layer is formed mostly by titanium nitride, and that other elements (e.g., impurities) may be present in a smaller proportion, e.g., having less weight percentage or less volume percentage compared to titanium nitride.

The term "region" used with regard to a "source region", "drain region", "channel region", and the like, may be used herein to mean a continuous region of a semiconductor portion (e.g., of a semiconductor wafer or a part of a semiconductor wafer, a semiconductor layer, a fin, a semiconductor nanosheet, a semiconductor nanowire, etc.). In some aspects, the continuous region of a semiconductor portion may be provided by semiconductor material having only one dominant doping type.

The word "over", used herein to describe forming a feature, e.g., a layer "over" a side or surface, may be used to mean that the feature, e.g., the layer, may be formed "directly on", e.g., in direct contact with, the implied side or surface. The word "over", used herein to describe forming a feature, e.g., a layer "over" a side or surface, may be used to mean that the feature, e.g., the layer, may be formed "indirectly on" the implied side or surface with one or more additional layers being arranged between the implied side or surface and the formed layer.

The term "lateral" used with regards to a lateral dimension (in other words a lateral extent) of a structure, a portion, a structure element, a layer, etc., provided, for example, over and/or in a carrier (e.g., a layer, a substrate, a wafer, etc.) or "laterally" next to, may be used herein to mean an extent or a positional relationship along a surface of the carrier. That means, in some aspects, that a surface of a carrier (e.g., a surface of a layer, a surface of a substrate, a surface of a wafer, etc.) may serve as reference, commonly referred to as the main processing surface. Further, the term "width" used with regards to a "width" of a structure, a portion, a structure element, a layer, etc., may be used herein to mean the lateral dimension (or in other words the lateral extent) of a structure. Further, the term "height" used with regards to a height of a structure, a portion, a structure element, a layer, etc., may be used herein to mean a dimension (in other words an extent) of a structure in a direction perpendicular to the surface of a carrier (e.g., perpendicular to the main processing surface of a carrier).

The term "thickness" used with regards to a "thickness" of a layer may be used herein to mean the dimension (in other words an extent) of the layer perpendicular to the surface of the support (the material or material structure) on which the layer is formed (e.g., deposited or grown). If a surface of the support is parallel to the surface of the carrier (e.g., parallel to the main processing surface) the "thickness" of the layer formed on the surface of the support may be the same as the height of the layer.

According to various aspects, various properties (e.g., physical properties, chemical properties, etc.) of a first component (e.g., elements, layers, structures, portions, etc.) and a second component may be compared to one another. It may be found that two or more components may be—with reference to a specific property—either equal to each other or different from one another. As a measure, a value that represents such a property may be either equal or not. In general, a skilled person may understand from the context of the application whether two values or properties are equal or not, e.g., usually, if values are in the range of a usual tolerance, they may be regarded equal. However, in some aspects or as long as not otherwise mentioned or understood, two values that differ from one another with at least 1% relative difference may be considered different from one another. Accordingly, two values that differ from one another with less than 1% relative difference may be considered equal to each other.

It may be understood, that the physical term "electrical conductivity" (also referred to as specific conductance, specific electrical conductance, as examples) may be defined as a material dependent property reciprocal to the physical term "electrical resistivity" (also referred to as specific electrical resistance, volume resistivity, as examples). Further properties of a layer or structure may be defined material dependent and the geometry dependent, e.g., by the physical terms "electrical resistance" and "electrical conductance".

The terms "at least one" and "one or more" may be understood to include any integer number greater than or equal to one, i.e., one, two, three, four, [ . . . ], etc. The term "a plurality" or "a multiplicity" may be understood to include any integer number greater than or equal to two, i.e., two, three, four, five, [ . . . ], etc. The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

According to various aspects, the properties and/or the structure of the memory element, an electrode, an electrically conductive electrode layer, and/or a functional layer as described herein may be evaluated with techniques known in the art. As an example, transmission electron microscopy (TEM) may be used to determine the structure of an electrode, for example the presence of one or more electrode layers and/or the presence of one or more functional layers in the electrode. TEM may be used for identifying a layer, an interface, a crystal structure, a microstructure, and other properties. As another example, X-ray crystallography (X-ray diffraction) may be used to determine various properties of a layer or a material, such as the crystal structure, the lattice properties, the size and shape of a unit cell, the chemical composition, the phase or alteration of the phase, the presence of stress in the crystal structure, the microstructure, and the like. As a further example, energy-dispersive X-ray spectroscopy (EDS) may be used to determine the chemical composition of a layer or a material (e.g., the presence and/or the content of an element in the layer or material). As a further example, Rutherford backscattering spectrometry (RBS) may be used to determine the structure and/or the composition of a material. As a further example, secondary ion mass spectrometry (SIMS) may be used to analyze the molecular composition of the upper monolayers of a solid (e.g., for analyzing the spatial distribution (e.g., the gradient) of an element across the solid).

While the invention has been particularly shown and described with reference to specific aspects, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:

1. A memory cell comprising:

a first electrode;

a second electrode; and a memory element disposed between the first electrode and the second electrode, the memory element comprising a spontaneously polarizable material, the first electrode, the second electrode, and the memory element forming a memory capacitor, wherein at least one of the first electrode or the second electrode comprises:

an electrically conductive electrode layer, and a functional layer comprising a semi-conductive material, wherein the functional layer is in direct physical contact with the memory element, wherein the semi-conductive material is configured to change its material properties based on at least one of:

a function of an amount of oxygen incorporated therein, an application of an electric field via the first electrode and the second electrode, a function of an amount of oxygen incorporated in the spontaneously polarizable material, or combinations thereof.

2. The memory cell according to claim 1, wherein an average grain width of the spontaneously polarizable material is greater than 20 nm.

3. The memory cell according to claim 1, wherein the semi-conductive material is a semi-conductive metal oxide.

4. The memory cell according to claim 3, wherein the semi-conductive metal oxide is semi-conductive tungsten oxide.

5. The memory cell according to claim 1, wherein the semi-conductive material is configured to store and release oxygen by application of an electric field via the first electrode and the second electrode.

6. The memory cell according to claim 1, wherein the spontaneously polarizable material of the memory element is a remanent-polarizable material.

7. The memory cell according to claim 1, wherein the first electrode comprises a first functional layer and wherein the second electrode comprises a second functional layer, and wherein the first functional layer comprises a first oxygen concentration different from a second oxygen concentration of the second functional layer.

8. The memory cell according to claim 1, wherein the material properties comprise structural properties, mechanical properties, and/or electronic properties.

9. The memory cell according to claim 8, wherein the material properties include at least one of the structural properties including a crystal structure of the semi-conductive material, the mechanical properties including a mechanical stress within the semi-conductive material, or the electronic properties including at least one of a type of electric conductivity, an electric conductivity, a work function, or a band structure of the semi-conductive material.

10. The memory cell according to claim 1, wherein the semi-conductive material is amorphous.

11. The memory cell according to claim 1, wherein the spontaneously polarizable material is configured to change its material properties based on at least one of a transfer of oxygen from the functional layer or a transfer of oxygen to the functional layer.

12. The memory cell according to claim 1, wherein the spontaneously polarizable material is configured to change its material properties as a function of an amount of oxygen incorporated in the semi-conductive material of the functional layer.

13. The memory cell according to claim 12, wherein the material properties include at least one of structural properties including a crystal structure of the spontaneously polarizable material, mechanical properties including a mechanical stress within the spontaneously polarizable material, or electronic properties including at least one of a band structure of the spontaneously polarizable material, a polarization/voltage drop characteristic or polarization/electric field characteristic of the spontaneously polarizable material, a change of the spontaneously polarizable material from being dielectric to being ferroelectric, or a change of the spontaneously polarizable material from being antiferroelectric to being ferroelectric.

14. A memory cell, comprising:

a first electrode;

a second electrode; and a memory element disposed between the first electrode and the second electrode, the memory element comprising a spontaneously polarizable material, the first electrode, the second electrode, and the memory element forming a memory capacitor, wherein the first electrode and/or the second electrode comprises:

an electrically conductive electrode layer, and a functional layer in direct physical contact with the memory element, wherein the functional layer is configured to store and release oxygen by application of an electric field via the first electrode and the second electrode.

15. A memory cell comprising:

a first electrode;

a second electrode; and a memory element disposed between the first electrode and the second electrode, the memory element comprising a spontaneously polarizable material, wherein an average grain width of the spontaneously polarizable material is greater than 20 nm;

the first electrode, the second electrode, and the memory element forming a memory capacitor, wherein at least one of the first electrode or the second electrode comprises:

an electrically conductive electrode layer, and a functional layer comprising a semi-conductive material, wherein the functional layer is in direct physical contact with the memory element.

16. A memory cell comprising:

a first electrode;

a second electrode; and a memory element disposed between the first electrode and the second electrode, the memory element comprising a spontaneously polarizable material;

the first electrode, the second electrode, and the memory element forming a memory capacitor, wherein at least one of the first electrode or the second electrode comprises:

an electrically conductive electrode layer, and a functional layer comprising a semi-conductive material, wherein the functional layer is in direct physical contact with the memory element, and wherein the first electrode comprises a first functional layer and the second electrode comprises a second functional layer, and wherein the first functional layer comprises a first oxygen concentration different from a second oxygen concentration of the second functional layer.

17. The memory cell according to claim 16, wherein an average grain width of the spontaneously polarizable material is greater than 20 nm.

18. A memory cell comprising:

a first electrode;

a second electrode; and a memory element disposed between the first electrode and the second electrode, the memory element comprising a spontaneously polarizable material, wherein the spontaneously polarizable material is configured to change its material properties based on at least one of a transfer of oxygen from the functional layer, a transfer of oxygen to the functional layer, an amount of oxygen incorporated in the semi-conductive material of the functional layer, or combinations thereof;

the first electrode, the second electrode, and the memory element forming a memory capacitor, wherein at least one of the first electrode or the second electrode comprises:

an electrically conductive electrode layer, and a functional layer comprising a semi-conductive material, wherein the functional layer is in direct physical contact with the memory element.

19. The memory cell according to claim 18, wherein an average grain width of the spontaneously polarizable material is greater than 20 nm.

* * * * *